US012724067B2

(12) United States Patent
Jang et al.

(10) Patent No.: US 12,724,067 B2
(45) Date of Patent: Sep. 1, 2026

(54) SEMICONDUCTOR TEST APPARATUS AND POWER SUPPLY METHOD THEREOF

(71) Applicant: SAMSUNG ELECTRONICS CO., LTD., Suwon-si (KR)

(72) Inventors: Ungjin Jang, Suwon-si (KR); Hyucksoo Jeon, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 143 days.

(21) Appl. No.: 18/635,088

(22) Filed: Apr. 15, 2024

(65) Prior Publication Data

US 2025/0044353 A1 Feb. 6, 2025

(30) Foreign Application Priority Data

Aug. 4, 2023 (KR) ........................ 10-2023-0102290

(51) Int. Cl.
*G01R 31/317* (2006.01)
*G01R 31/319* (2006.01)

(52) U.S. Cl.
CPC . *G01R 31/31721* (2013.01); *G01R 31/31713* (2013.01); *G01R 31/31926* (2013.01)

(58) Field of Classification Search
CPC ........ G01R 31/31721; G01R 31/31713; G01R 31/31926; G01R 31/31924; H01L 21/67253
See application file for complete search history.

(56) References Cited

U.S. PATENT DOCUMENTS 5,952,733 A * 9/1999 Johnston ................. H02J 1/102 363/71
6,043,672 A 3/2000 Sugasawara
6,756,807 B2 6/2004 Johnson et al.
7,675,310 B2 3/2010 Sullivan
9,214,809 B2 12/2015 Buterbaugh et al.
9,785,127 B2 10/2017 Park
11,611,281 B2 3/2023 Nakamura et al.
2002/0186037 A1* 12/2002 Eldridge .......... G01R 31/31721 324/754.07

(Continued)

FOREIGN PATENT DOCUMENTS

CN 102890232 1/2013
KR 10-2015-0004169 A 1/2015

*Primary Examiner* — Dominic E Hawkins

(74) *Attorney, Agent, or Firm* — Morgan, Lewis & Bockius LLP

(57) ABSTRACT

Provided are a semiconductor test apparatus for simultaneously testing a maximum number of semiconductor chips, and a power supply method of the semiconductor test apparatus. The semiconductor test apparatus includes a tester including a power supply configured to simultaneously supply power to a plurality of devices under test (DUTs) during a test, and a test board arranged between the tester and the plurality of DUTs and transmitting the power from the power supply to the tester, wherein the power supply includes a plurality of power channels, and each of the plurality of DUTs receive two or more types of power from the power channels, each type of power being power supplied at a respective supply voltage for the DUT, the power supply shares current between the plurality of power channels and supplies the shared current amount to each of the plurality of DUTs.

20 Claims, 19 Drawing Sheets

(56) References Cited

U.S. PATENT DOCUMENTS

| | | | | |
|---|---|---|---|---|
| 2004/0059536 | A1* | 3/2004 | Chang | G01R 31/31919 702/120 |
| 2011/0320175 | A1 | 12/2011 | Perry et al. | |
| 2015/0026531 | A1* | 1/2015 | Kosonocky | G01R 31/318575 714/726 |
| 2016/0091531 | A1* | 3/2016 | Park | G01R 1/0408 324/756.07 |
| 2020/0386786 | A1* | 12/2020 | Kim | G01R 1/07342 |
| 2022/0229109 | A1* | 7/2022 | Tseng | G11C 29/56004 |
| 2024/0201251 | A1* | 6/2024 | Montenegro | G01R 31/2889 |

* cited by examiner (COMPARATIVE EXAMPLE)

(COMPARATIVE EXAMPLE)

SEMICONDUCTOR TEST APPARATUS AND POWER SUPPLY METHOD THEREOF

CROSS-REFERENCE TO RELATED APPLICATION

This application is based on and claims priority under 35 U.S.C. § 119 to Korean Patent Application No. 10-2023-0102290, filed on Aug. 4, 2023, in the Korean Intellectual Property Office, the disclosure of which is incorporated by reference herein in its entirety.

TECHNICAL FIELD

This disclosure relates generally to a test apparatus, and more particularly, to a semiconductor test apparatus for simultaneously testing multiple semiconductor devices, and a power supply method thereof.

DISCUSSION OF RELATED ART

Generally, a semiconductor manufacturing process includes a fabrication (FAB) process of forming a plurality of semiconductor chips on a wafer, and an electrical die sorting (EDS) process of testing an electrical characteristic of each semiconductor chip formed on the wafer. The EDS process determines and discards poor/fair quality semiconductor chips. This is followed by an assembly process of packaging a device with high quality semiconductor chips determined through the EDS process, where the packaging protects the device from external mechanical, physical, and chemical impacts.

With the EDS process, the fair/poor quality of the chips may be determined by a signal output in response to an electrical signal received after transmitting power and an electrical signal to each chip on the wafer.

SUMMARY

Embodiments of the inventive concept provide a semiconductor test apparatus for simultaneously testing a maximum number of semiconductor chips, and a power supply method of the semiconductor test apparatus.

According to an aspect of the inventive concept, there is provided a semiconductor test apparatus including a tester circuit including a power supply configured to simultaneously supply power to a plurality of devices under test (DUTs) during a test, and a test board arranged between the tester and the plurality of DUTs and transmitting the power from the power supply to the tester, wherein the power supply includes a plurality of power channels, each of the plurality of DUTs receive two or more types of power from the power channels, each type of power being power supplied at a respective supply voltage for a DUT, and the power supply shares current between the plurality of power channels and supplies the shared current to each of the plurality of DUTs.

According to another aspect of the inventive concept, there is provided a semiconductor test apparatus including a tester circuit including a power supply configured to simultaneously supply power to a plurality of devices under test (DUTs) during a test, a test signal transmitter configured to input a test signal to the plurality of DUTs and receive a response signal from the plurality of DUTs, a logic generation determiner circuit configured to generate the test signal and determine a failure of the plurality of DUTs, based on the response signal, and a controller configured to control the power supply and the logic generation determiner, and a test board arranged between the tester and the plurality of DUTs, transmitting the power of the power supply and the test signal of the test signal transmitter to the plurality of DUTs, and transmitting the response signal from the plurality of DUTs to the test signal transmitter, wherein the power supply includes a plurality of power channels, the plurality of power channels are divided into a plurality of groups, each of the plurality of groups includes a set number of power channels, and each of the plurality of DUTs receives two or more types of power from the power channels, each type of power being power supplied at a respective supply voltage for a DUT, and each of the plurality of groups shares current between the plurality of power channels and supplies the shared current to each of the plurality of DUTs.

According to another aspect of the inventive concept, there is provided a semiconductor test apparatus including a power supply configured to simultaneously supply power to a plurality of DUTs during a test, a test signal transmitter configured to input a test signal to the plurality of DUTs and receive a response signal from the plurality of DUTs, a logic generation determiner configured to generate the test signal and determine a failure of the plurality of DUTs, based on the response signal, and a controller configured to control the power supply and the logic generation determiner, wherein the power supply includes a plurality of power channels, the plurality of power channels are divided into a plurality of groups, each of the plurality of groups includes a set number of power channels, and when each of the plurality of DUTs receives two or more types of power from the power channels, each type of power being power supplied at a respective supply voltage for a DUT, each of the plurality of groups shares current between the plurality of power channels and supplies the shared current to each of the plurality of DUTs.

According to another aspect of the inventive concept, there is provided a power supply method of a semiconductor test apparatus, including, in a tester including a power supply configured to simultaneously supply power to a plurality of DUTs during a test, when the power supply includes a plurality of power channels, the plurality of power channels are divided into a plurality of groups, each of the plurality of groups includes a set number of power channels, and the power supply is configured to supply two or more types of power to each of the plurality of DUTs, each type of power being power supplied at a respective supply voltage for a DUT, supplying a first current amount to each of the plurality of groups, dividedly inputting the first current amount to the plurality of power channels, and supplying, by the plurality of power channels, a corresponding current amount to each of the plurality of DUTs, wherein each of the plurality of groups shares current between the plurality of power channels and supplies the shared current to each of the plurality of DUTs.

BRIEF DESCRIPTION OF THE DRAWINGS

Embodiments will be more clearly understood from the following detailed description taken in conjunction with the accompanying drawings. Various elements of the same or similar type may be distinguished by annexing the reference label with an underscore/dash and second label that distinguishes among the same/similar elements (e.g., −1, −2), or directly annexing the reference label with a second label. However, if a given description uses only the first reference label, it is applicable to any one of the same/similar elements having the same first reference label irrespective of the second label.

DETAILED DESCRIPTION OF EMBODIMENTS

Figure 1A:
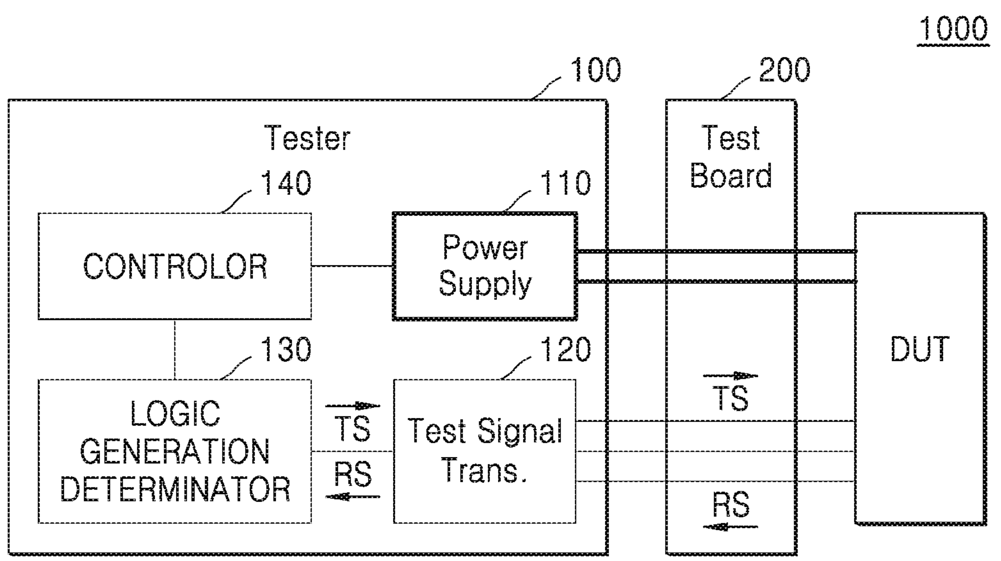
FIG. 1A is a block diagram of a semiconductor test apparatus according to an embodiment.

Hereinafter, embodiments will be described in detail with reference to the accompanying drawings. In the drawings, like reference numerals are used for like elements and redundant descriptions thereof will be omitted.

Figure 1B:
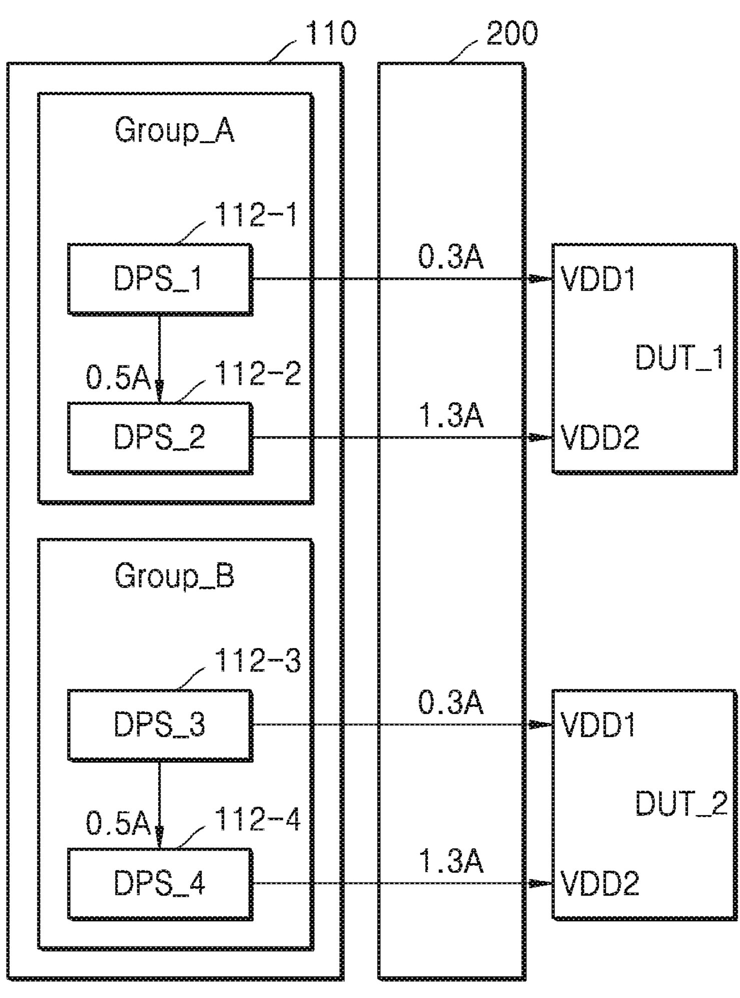
FIG. 1B is a conceptual diagram for describing an operation by which a power supply of the semiconductor test apparatus of FIG. 1A supplies power.

FIG. 1A is a block diagram of a semiconductor test apparatus 1000 according to an embodiment, and FIG. 1B is a conceptual diagram for describing an operation by which a power supply 110 of the semiconductor test apparatus 1000 of FIG. 1A supplies power.

Referring to FIGS. 1A and 1B, the semiconductor test apparatus 1000 (hereafter, "test apparatus 1000", interchangeably) may be referred to as an automatic test equipment (ATE), which may operate based on an automatic test operation. The test apparatus 1000 may basically test a logic failure and a parametric failure. The logic failure may include a failure such as open/short, hard/soft, or the like, and the parametric failure may include a failure such as out of range results for Icc (e.g., bias current draw), current leakage, setup/hold time, voltage, refresh, or the like.

The test apparatus 1000 may include a tester circuit ("tester") 100 and a test board 200. The tester 100 may include the power supply 110, a test signal transmitter 120, a logic generation determiner circuit ("determiner") 130, and a controller 140. The power supply 110, the test signal transmitter 120, the logic generation determiner 130, and the controller 140 may correspond to functional classifications of components of the tester 100. For example, the tester 100 may include a test body and a test head as physical components, which may be connected to each other through wiring or the like.

The power supply 110 may simultaneously supply power to a plurality of devices under test (DUTs) during a test. The DUT may denote a semiconductor device that is actually tested. The power supply 110 may include a plurality of power channels 112. For example, the power supply 110 may include hundreds to thousands of power channels 112 to simultaneously supply power to the DUTs. However, the number of power channels 112 of the power supply 110 is not limited to the above numerical range. Meanwhile, the power from the power supply 110 may be supplied to the DUTs through the test board 200.

The power channels 112 may also be referred to as digital power supplies (DPSs) or programmable power supplies (PPSs) with respect to functional aspects. Accordingly, in FIG. 1B, DPS_1, DPS_2, DPS_3, and DPS_4 are indicated for first to fourth power channels 112-1 to 112-4 for explanatory purposes (e.g., among hundreds or thousands of power channels 112 in the power supply 110. Operations of the power supply 110 will be described in detail below with reference to FIGS. 1A and 1B.

The test signal transmitter 120 may receive a test signal TS(s) from the logic generation determiner 130 and input the test signal TS to the DUTs; receive respective response signals RS (e.g., RS_1, RS_2) from the DUTs; and send the response signal RS to the logic generation determiner 130. The inputting of the test signal TS and the receiving of the response signals RS by the test signal transmitter 120 may be performed through the test board 200.

The logic generation determiner 130 may generate the test signal TS and transmit the test signal to the DUTs, and determine failures of the DUTs based on the response signals RS received from the DUTs. The logic generation determiner 130 may transmit the test signal TS to the DUTs and receive the response signals RS through the test signal transmitter 120.

The controller 140 may control operations of the power supply 110 and the logic generation determiner 130. Also, the controller 140 may control operations of some or all other components in the test apparatus 1000.

The test board 200 may be arranged between the tester 100 and the DUTs and route the power from the power supply 110 to the DUTs. Also, the test board 200 may route the test signal and the response signals from and to the test signal transmitter 120 and the DUTs. For instance, the test board 200 may include a probe card used to test a semiconductor device in a wafer state. For example, the probe card may be used for a wafer burn-in test and a die sort test. Also, the probe card may be used by being mounted on a test head portion of the tester 100. The test board 200 may include an interface board used to test a semiconductor device in a package state.

An aspect of test apparatus 1000 may be its technology for efficiently using the power supply 110. Hereinafter, it is assumed that other resources of the tester 100 are not particularly limited or are at least sufficient enough for limitations caused by insufficiency of power channels supplying power to the DUTs.

In the test apparatus 1000, the power supply 110 of the tester 100 may include the power channels 112. The power channels 112 may be divided into groups. Each of the groups may include a set number of power channels 112. The number of power channels 112 included in each of the groups may be set according to various standards. For example, when two or more "types of power" are supplied to the DUT, each of the groups may include the number of power channels 112 corresponding to the two or more types of power. Herein, a "type of power" may be power supplied at a particular voltage level for the DUT. A first type of power may be power supplied at a first supply voltage of VDD1 (the supplied power is VDD1×I1, where I1 is the supplied current to the DUT terminal at which the voltage VDD1 is provided) and a second type of power may be power supplied at a second, different supply voltage of VDD2 (the power supplied is VDD2×I2, where I2 is the suppled current to the DUT terminal at which the voltage VDD2 is provided). Hereinafter, for convenience of description, an example in which the power supply 110 includes four power channels 112 and two different types of power are supplied to the DUT will be described.

For example, as shown in FIG. 1B, the power supply 110 may include the first to fourth power channels 112-1 to 112-4. Also, based on the two different types of power being supplied to the DUT, the first to fourth power channels 112-1 to 112-4 may be divided into two groups, i.e., a first group Group_A and a second group Group_B. In detail, the first group Group_A may include the first power channel 112-1 and the second power channel 112-2, and the second group Group_B may include the third power channel 112-3 and the fourth power channel 112-4.

In the semiconductor test apparatus 1000, the power supply 110 may share a current output between the power channels 112 in the group. For example, the first power channel 112-1 and the second power channel 112-2 may share the current output by the first group Group_A, and the third power channel 112-3 and the fourth power channel 112-4 may share the current output by second group Group_B. For instance, if a group with first and second power channels outputs a maximum current (current limit) of Imax, the first power channel in the group may output some of the maximum current and the second power channel may output the remaining current of the maximum current. As such, the power channels 112 "share the current" in the group, and thus, may effectively respond to the two different types of power supplied to the DUT. Another type of sharing disclosed herein is a "one-way sharing" (e.g., as in the embodiment of FIG. 4B) in which two power channels share a certain amount of current in a group, where a first power channel draws and uses current of a second power channel, but the second power channel is unable to use current of the first power channel.

For example, a first supply voltage VDD1 of the DUT may require a current of 0.3 A and a second supply voltage VDD2 may require a current of 1.3 A. Supply voltages VDD1 and VDD2 may be different voltage levels in some embodiments, or the same voltage in other embodiments (e.g., in the latter case, supplying different types of loads). Herein, each supply voltage VDD1 and VDD2 may be loosely referred to interchangeably as a "power source". Each power channel may supply power by providing both the requisite/desired supply voltage VDD1 or VDD2 and associated current level. For instance, each power channel may supply a maximum current of 0.8 A. When current is not shared between power channels (in a conventional test apparatus), neither one of two power channels supplies the current of 1.3 A with the second supply voltage VDD2, and thus, power required by one DUT cannot be supplied by the two power channels. As a result, to test one DUT, a separate power channel may need to be added in addition to the two power channels.

On the other hand, in the semiconductor test apparatus 1000, the power channels 112 may share current in each of the first group Group_A and the second group Group_B of the power supply 110. For example, in the first group Group_A, the first power channel 112-1 and the second power channel 112-2 may share current, and thus, the first power channel 112-1 may output a current of 0.3 A and the second power channel 112-2 may output current of 1.3 A. (It is noted here that specific current level examples herein are understood to encompass levels within a tolerance range, e.g., +/−10%.) Accordingly, the first power channel 112-1 may supply the current of 0.3 A with the first supply voltage VDD1 of the DUT and the second power channel 112-2 may supply the current of 1.3 A with the second supply voltage VDD2 of the DUT. As a result, in the test apparatus 1000, one DUT may be tested by using two power channels 112.

In the test apparatus 1000, a maximum suppliable current amount may be limited based on the number of power channels 112 in each group. For example, the first group Group_A and the second group Group_B each include two power channels 112, and thus, a maximum current may be limited to 1.6 A. As such, the maximum current supplied by each group is limited based on the number of power channels 112, and thus, the entire current supplied by the power supply 110 may not increase.

Figure 2A:
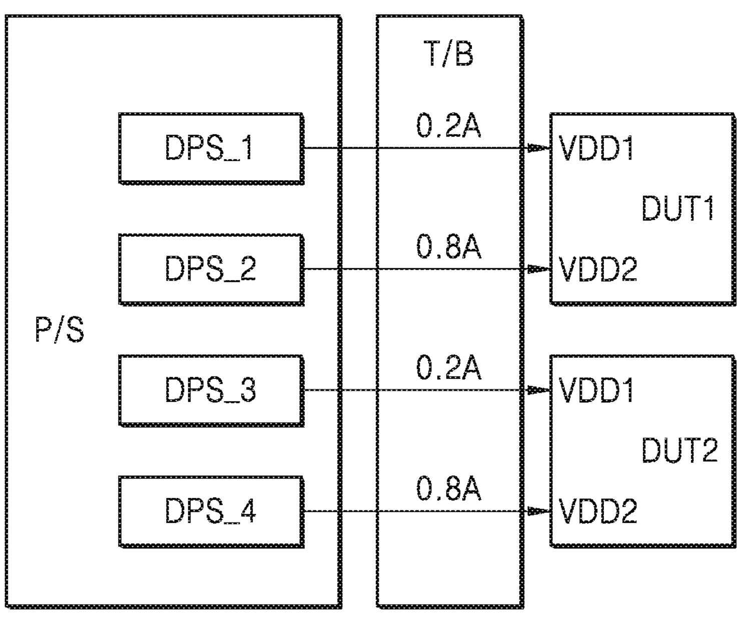
FIGS. 2A and 2B are conceptual diagrams for describing operations by which power supplies of semiconductor test apparatuses of comparative examples supply power.
Figure 2B:
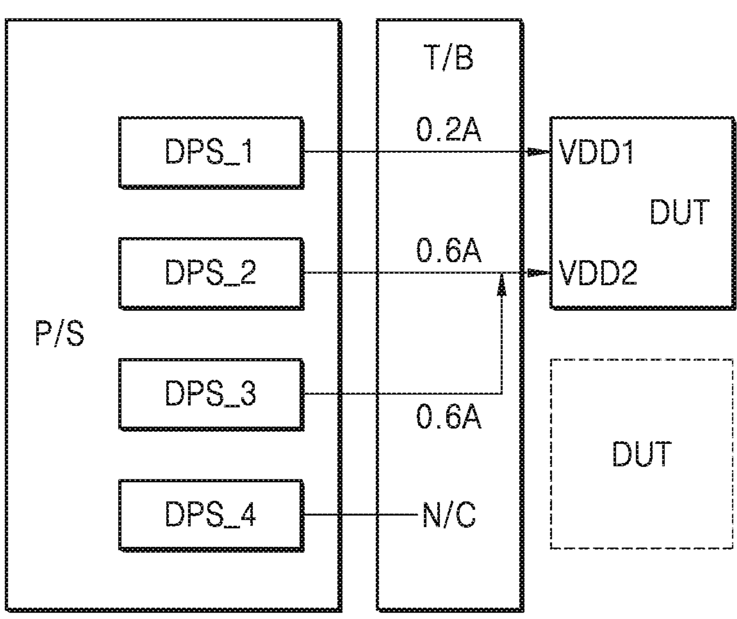

FIGS. 2A and 2B are conceptual diagrams for describing operations by which power supplies of semiconductor test apparatuses of comparative examples supply power.

Referring to FIGS. 2A and 2B, in the semiconductor test apparatuses of the comparative examples, a power supply P/S may include a plurality of power channels, for example, four power channels DPS_1 to DPS_4. The four power channels DPS_1 to DPS_4 may independently supply power to a DUT. Also, each of the power channels DPS_1 to DPS_4 may supply a current of 0.8 A or less. As shown in FIG. 2A, two DUTs DUT1 and DUT2 receive two different types of power, wherein, when the first power source VDD1 receives a current of 0.2 A and the second power source VDD2 receives a current of 0.8 A, the two DUTs DUT1 and DUT2 may each receive sufficient power through two power channels. In other words, the two DUTs DUT1 and DUT2 may receive sufficient power through four power channels. Here, T/B may denote a test board.

However, as shown in FIG. 2B, when a DUT receives two different types of power, where the first power source VDD1 is to receive a current amount of 0.2 A and the second power source VDD2 is to receive a current amount of 1.4 A, the first power source VDD1 may receive a current amount from one power channel, e.g., a first power channel DPS_1, but the second power source VDD2 is unable to receive a required/desired current through one power channel. Accordingly, two power channels, e.g., a second power channel DPS_2 and a third power channel DPS_3, may supply a current amount to the second power source VDD2. Accordingly, a fourth power channel DPS_4 may not be used to supply power. Consequently, the power supply P/S including the four power channels DPS_1 to DPS_4 may supply power to one DUT, and one power channel may be wasted, thereby largely decreasing efficiency of a simultaneous test.

As such, an issue in the semiconductor test apparatus of the comparative example may occur when two or more types of power are used according to a design purpose and an operation for each region in an internal circuit of a semiconductor device to be tested, i.e., a DUT, operating voltages and current consumption specifications of the two or more types of power are individual, and current consumption in a specific power source exceeds a suppliable maximum current amount of a power channel.

On the other hand, in the test apparatus 1000, as described with reference to FIG. 1B, the four power channels DPS_1 to DPS_4 are divided in groups of two in the first group Group_A and the second group Group_B, and current amounts of the power channels DPS_1 to DPS_4 are shared in each of the first group Group_A and the second group Group_B to increase efficiency of power supply. For example, four power channels may simultaneously supply power to two DUTs without waste of power channels. Accordingly, efficiency of a simultaneous test may be largely improved.

For reference, regarding the issue of the semiconductor test apparatus of the comparative example, a case where the number of power channels is increased will be described. There may be a power supply that includes 1,024 power channels capable of supplying up to 800 mA and DUTs of which peak currents for two types of supply voltages, i.e., VDD1 and VDD2, are 250 mA and 1.2 A. Here, there is a sufficient number of signal channels, and thus, the number of DUTs capable of being simultaneously tested may be limited only by the number of power channels. In this case, when only one power channel is connected to VDD2, a current level is insufficient, and therefore two power channels need to be assigned to configure an environment for supplying 1.6 A. For VDD1, even when only 250 mA is consumed, one power channel is assigned, and thus, three power channels in total are assigned per DUT, and only 341 DUTs are simultaneously tested according to simple calculation.

Obviously, when a maximum current amount suppliable by a power channel is increased to be 1.2 A or more, only one power channel may be assigned to VDD2, and thus, the number of DUTs capable of being simultaneously tested may be increased to 512, but in this case, maximum power to be supplied by the semiconductor test apparatus to all components is increased as much, and thus, high-priced components may need to be adopted for a circuit of a power system. Moreover, the number of components may need to be increased, and heat dissipation-related components may need to be strengthened. Accordingly, price or size of the semiconductor test apparatus may be potentially adversely affected, and energy consumption may also increase. A method of increasing the number of power channels may also lead to similar issues.

On the other hand, in the test apparatus 1000, as described with reference to FIG. 1B, power channels are dividedly included in groups and the power channels share current in each group, whereby power supply efficiency may be optimized, thereby increasing efficiency of a simultaneous test of the test apparatus 1000.

Figure 3A:
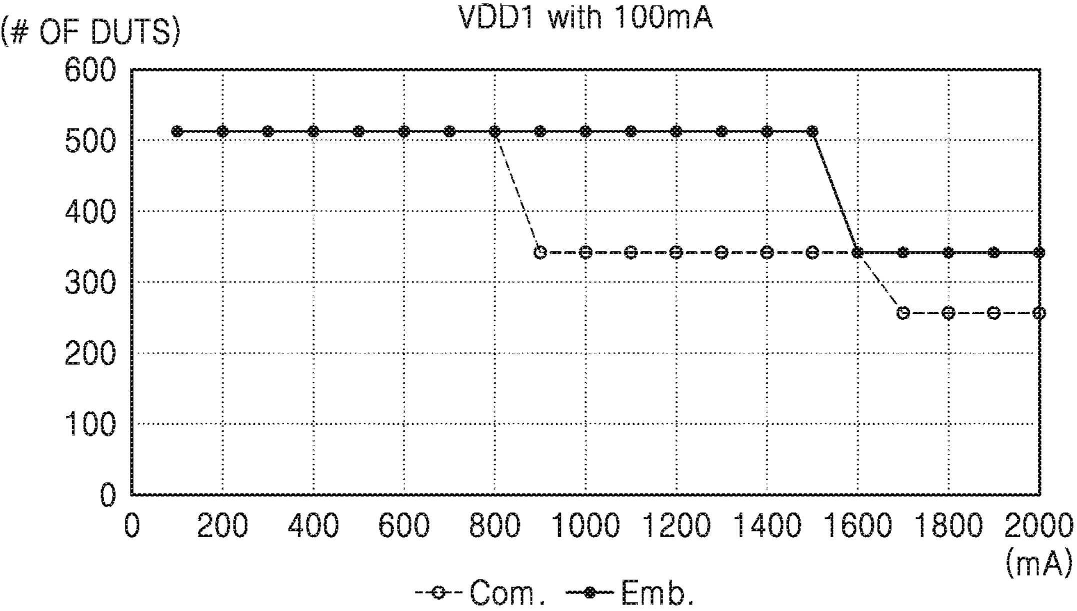
FIGS. 3A, 3B and 3C are graphs showing the numbers of devices under test (DUTs) capable of being simultaneously tested according to current amounts in the semiconductor test apparatus of FIG. 1A and the semiconductor test apparatus of the comparative example.
Figure 3B:
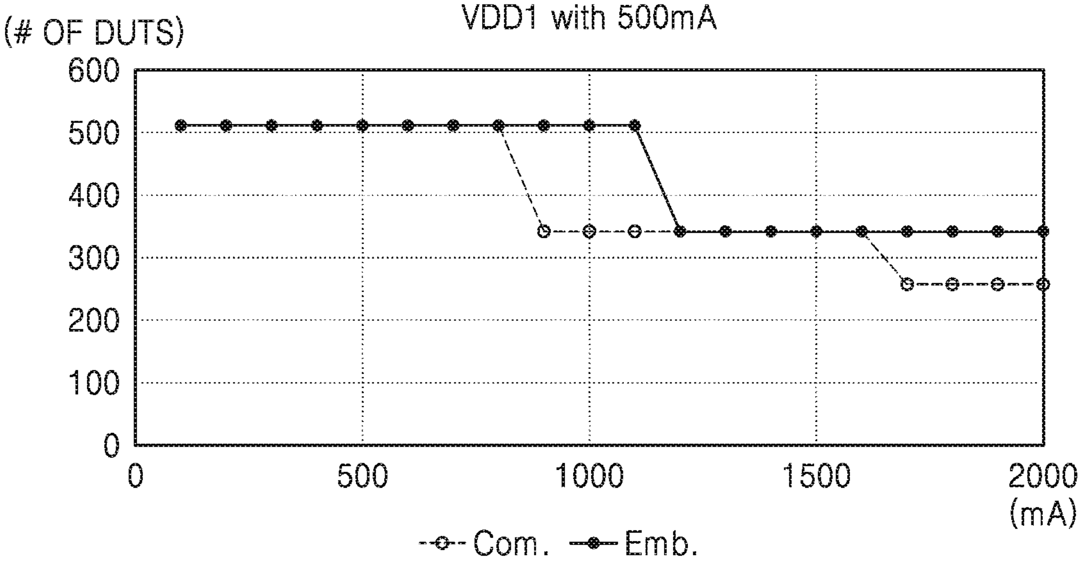
Figure 3C:
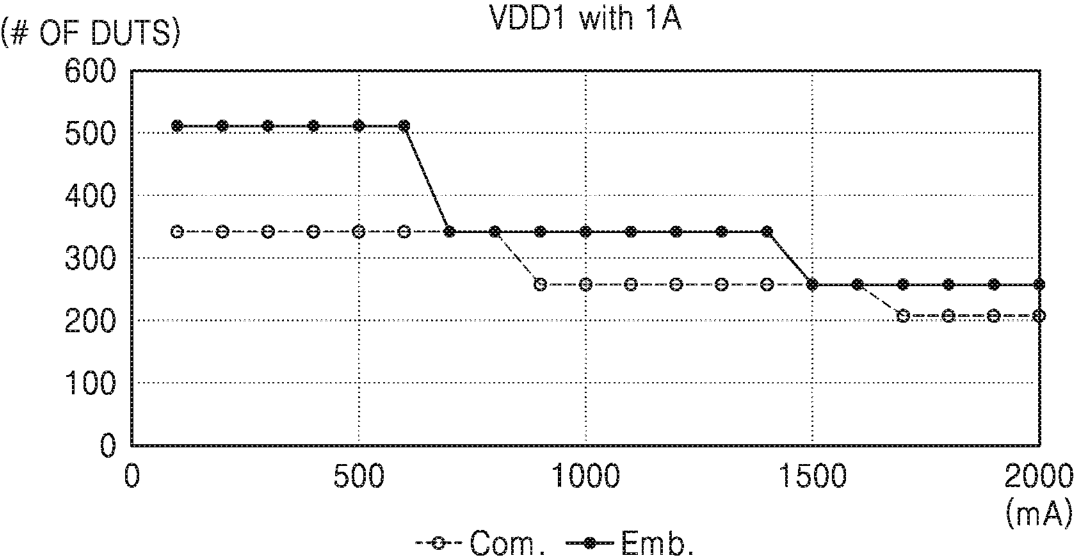

FIGS. 3A to 3C are graphs showing the numbers of DUTs capable of being simultaneously tested according to current amounts in the test apparatus 1000 of FIG. 1A and the semiconductor test apparatuses of the comparative examples.

In the graphs of FIGS. 3A to 3C, two different types of power may be supplied to DUTs and a power supply may include 1024 power channels. Also, in a semiconductor test apparatus Com. of a comparative example, each power channel of the power supply P/S outputs a current amount of 800 mA or less. In a semiconductor test apparatus Emb. of the present embodiment, the power channels 112 of the power supply 110 are grouped in groups of two, each power channel 112 outputs a current amount of 1,600 mA or less, and each group supplies 1,600 mA. In each of the graphs of FIGS. 3A to 3C, an x-axis denotes a current amount supplied to the second power source VDD2 and a y-axis denotes the number of DUTs capable of being simultaneously tested.

Referring to FIGS. 3A to 3C, when the first power source VDD1 receives a current amount of 100 mA as shown in FIG. 3A, the number of DUTs capable of being simultaneously tested by the semiconductor test apparatus Com. of the comparative example may be less than that by the semiconductor test apparatus Emb. of the present embodiment when a current required by the second power source VDD2 increases.

In detail, when the second power source VDD2 receives a current amount of 800 mA, the semiconductor test apparatus Com. of the comparative example and the semiconductor test apparatus Emb. of the present embodiment may both simultaneously test 512 DUTs. However, when the second power source VDD2 receives a current amount of more than 800 mA but less than 1600 mA, the semiconductor test apparatus Com. of the comparative example requires three power channels for one DUT, and thus, may simultaneously test 341 DUTs. On the other hand, the semiconductor test apparatus Emb. of the present embodiment still requires two power channels for one DUT, and thus, may simultaneously test 512 DUTs.

When the second power source VDD2 receives a current amount of more than 1600 mA, the semiconductor test apparatus Com. of the comparative example requires four power channels for one DUT, and thus, may simultaneously test 256 DUTs. On the other hand, the semiconductor test apparatus Emb. of the present embodiment still requires only three power channels for one DUT, and thus, may simultaneously test 341 DUTs.

FIG. 3B is a graph showing a case where the first power source VDD1 receives a current amount of 500 mA, and FIG. 3C is a graph showing the number of DUTs capable of being simultaneously tested according to a current level required by the second power source VDD2 for a case where the first power source VDD1 receives a current of 1 A. As shown in the graphs of FIGS. 3B and 3C, when a current required by the second power source VDD2 increases, the number of DUTs capable of being simultaneously tested by the semiconductor test apparatus Com. of the comparative example may be less than that by the semiconductor test apparatus Emb. of the present embodiment.

In detail, in the graph of FIG. 3B, when the second power source VDD2 receives a current amount of 800 mA, the semiconductor test apparatus Com. of the comparative example and the semiconductor test apparatus Emb. of the present embodiment may both simultaneously test 512 DUTs. However, when the second power source VDD2 receives a current amount of more than 800 mA but less than 1600 mA, the semiconductor test apparatus Com. of the comparative example requires three power channels for one DUT, and thus, may simultaneously test 341 DUTs. On the other hand, the semiconductor test apparatus Emb. of the present embodiment still requires two power channels for one DUT for a current of 1100 mA, and thus, may simultaneously test 512 DUTs.

When the second power source VDD2 receives a current amount of more than 1600 mA, the semiconductor test apparatus Com. of the comparative example requires four power channels for one DUT, and thus, may simultaneously test 256 DUTs. On the other hand, the semiconductor test apparatus Emb. of the present embodiment requires three power channels for one DUT for a current amount of more than 1100 mA, and thus, may simultaneously test 341 DUTs.

In the graph of FIG. 3C, up to a current output of 800 mA required by the second power source VDD2, the semiconductor test apparatus Com. of the comparative example may require three power channels for one DUT, and thus, may simultaneously test 341 DUTs. On the other hand, up to a current output of 1600 mA is supplied per group for the semiconductor test apparatus Emb. of the present embodiment, and thus, only two power channels are required for one DUT up to a current amount of 600 mA required by the second power source VDD2. Accordingly, 512 DUTs may be simultaneously tested.

When a current amount required by the second power source VDD2 is more than 800 mA but less than 1600 mA, the semiconductor test apparatus Com. of the comparative example may require four power channels for one DUT, and thus, may simultaneously test 256 DUTs. On the other hand, for the semiconductor test apparatus Emb. of the present embodiment, only one power channel may be added for a current amount of more than 600 mA but less than 1400 mA required by the second power source VDD2, and thus, three power channels are required for one DUT, and accordingly, 341 DUTs may be simultaneously tested.

Lastly, when the second power source VDD2 receives a current amount of more than 1600 mA, the semiconductor test apparatus Com. of the comparative example requires five power channels for one DUT, and thus, may simultaneously test 204 DUTs. On the other hand, for the semiconductor test apparatus Emb. of the present embodiment, when the second power source VDD2 receives a current amount of more than 1400 mA, four power channels are required for one DUT, and thus, 256 DUTs may be simultaneously tested.

Figure 4A:
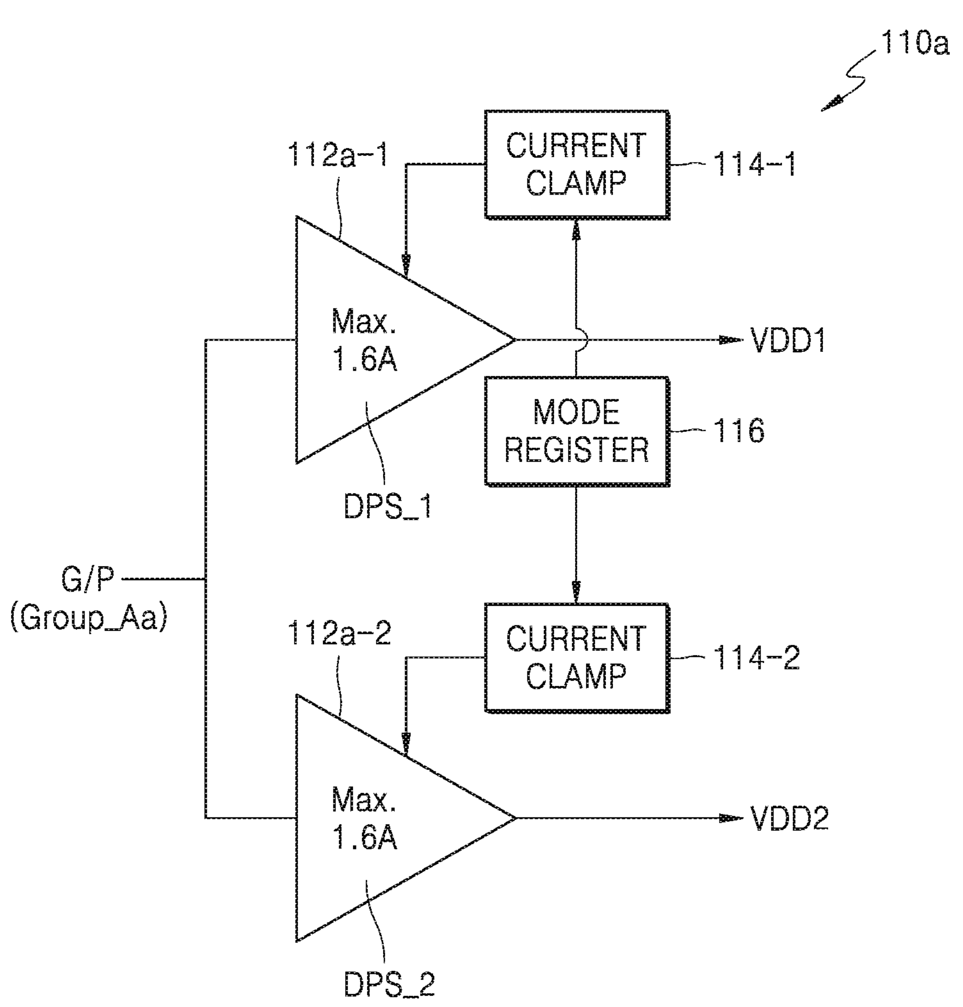
FIGS. 4A, 4B and 4C are circuit diagrams of the power supply of FIG. 1B that is specifically implemented.
Figure 4B:
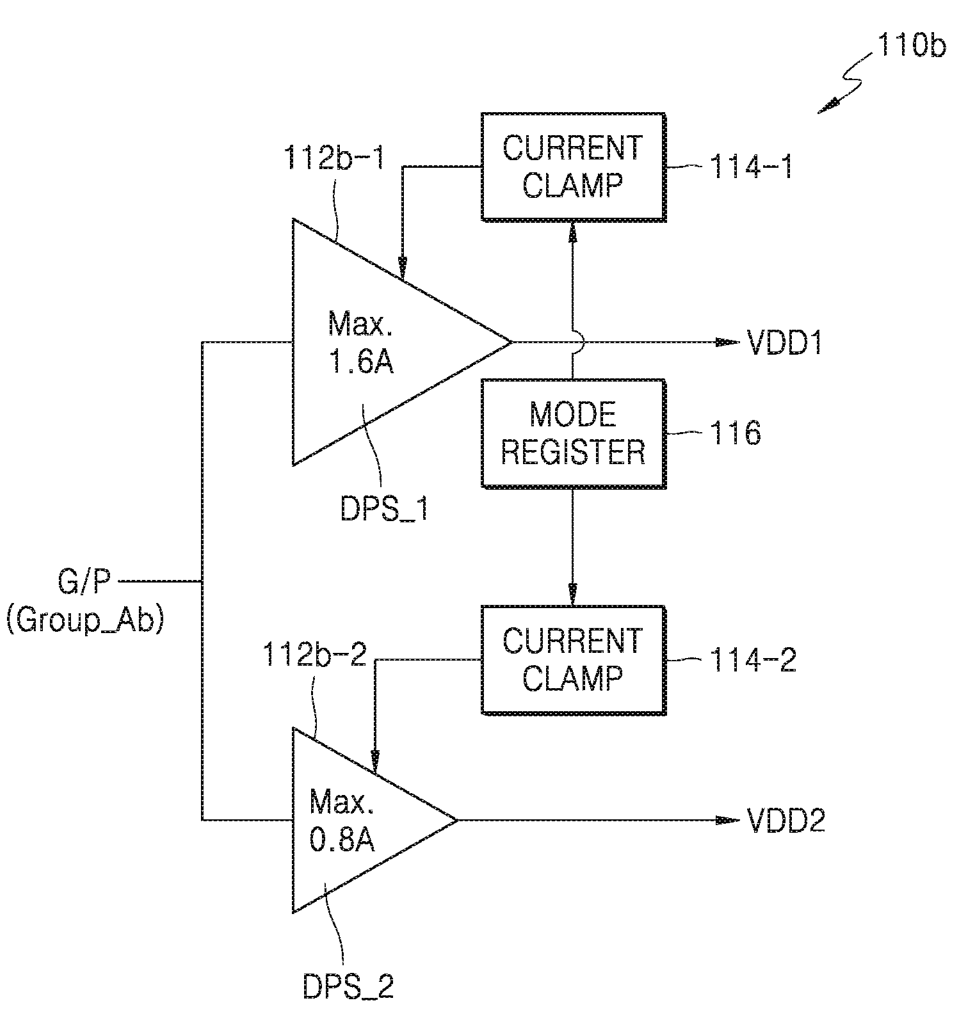
Figure 4C:
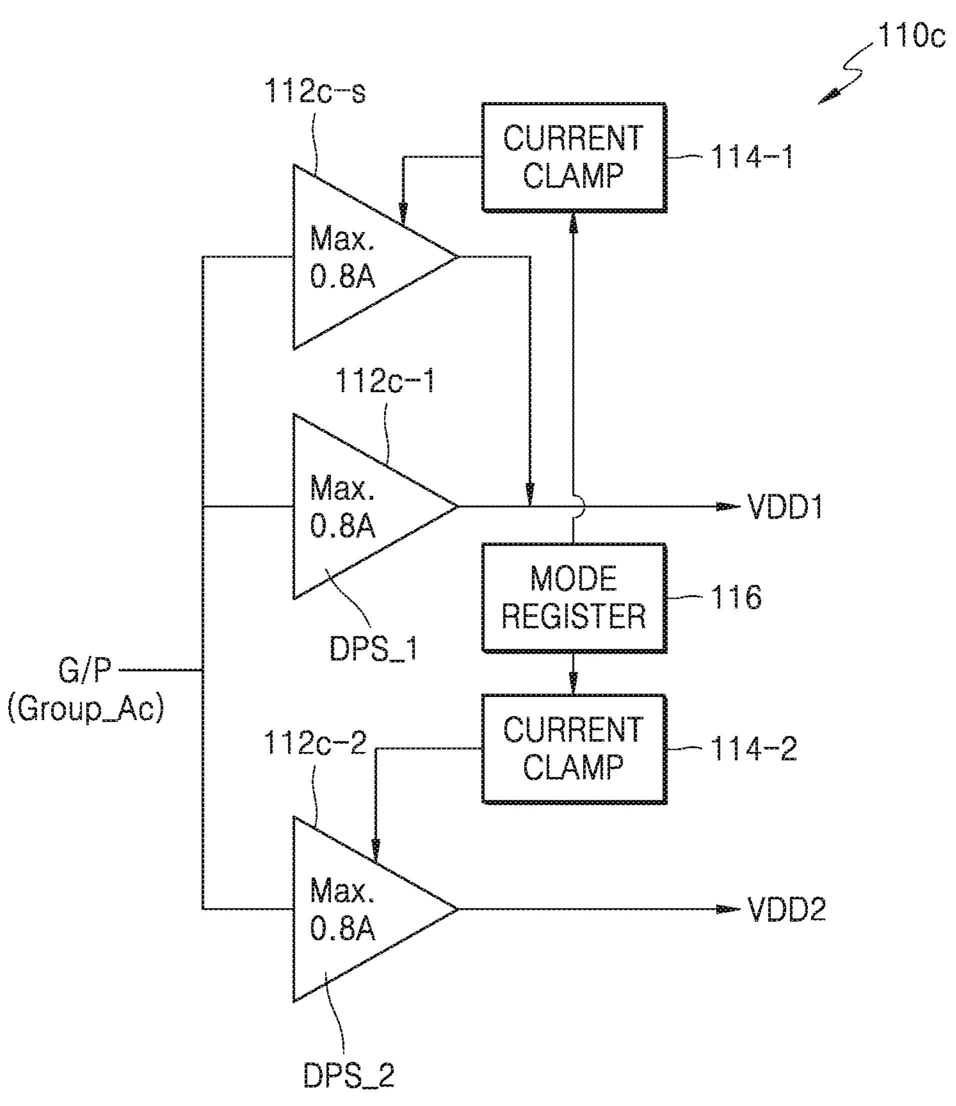

FIGS. 4A to 4C are circuit diagrams of respective examples of the power supply 110 of FIG. 1B, and illustrate circuit diagrams for power channels 112 in one group. FIGS. 4A to 4C will be described with reference to FIG. 1B together, and details already described with reference to FIGS. 1A to 3C will be briefly described or omitted.

Referring to FIG. 4A, a power supply 110*a* of the test apparatus 1000 may include a plurality of groups, and each group may include two power channels 112*a*. For example, a first group Group_Aa may include the first power channel 112-1 and the second power channel 112-2. The first power channel 112-1 and the second power channel 112-2 may each output a maximum current of 1.6 A. In other words, the first power channel 112-1 and the second power channel 112-2 may each output a current amount between about 0 A to about 1.6 A. Meanwhile, a maximum current amount of the power channels 112*a* may be limited by a current limiter (clamp) 114. For example, a maximum current of the first power channel 112-1 may be limited to 1.6 A by a first current clamp 114-1, and a maximum current of the second power channel 112-2 may be limited to 1.6 A by a second current clamp 114-2. Information about a maximum current may be stored in a mode register 116, and the current clamp 114 may limit the maximum current of the power channels 112*a*, based on information of the mode register 116. In addition, circuits in the power channels 112*a* may be changed such that each of the first power channel 112-1 and the second power channel 112-2 may supply the maximum current of 1.6 A. In other words, the circuits may be designed such that capacities of the first power channel 112-1 and the second power channel 112-2 are increased.

Meanwhile, a maximum current output by each group of the power supply 110*a* may be limited. For example, a maximum current output from the first group Group_Aa may be limited to 1.6 A. In detail, the sum of maximum currents of the first power channel 112-1 and the second power channel 112-2 does not exceed 1.6 A, for example, when the first power channel 112-1 outputs a current of 1.6 A, the second power channel 112-2 outputs a current of 0 A; when the first power channel 112-1 outputs a current of 0.8 A, the second power channel 112-2 outputs a maximum current of 0.8 A; and when the first power channel 112-1 outputs a current of 0 A, the second power channel 112-2 outputs a maximum current of 1.6 A.

Consequently, in the power supply 110*a* of the present embodiment, two power channels 112*a* in a group share and collectively use 1.6 A. Accordingly, one group power G/P may be substantially the same as power of two power channels, and additional power may not be consumed. Thus, the entire power of the power supply 110*a* may be substantially the same as the entire power of the power supply P/S of the comparative example including the same number of power channels.

In the power supply 110*a* of FIG. 4A, a case where a maximum current Imax of each power channel 112*a* in a group is increased by two times 0.8 A has been described, but the increase in the maximum current Imax of the power channels 112*a* in the group is not limited to two times. For example, power channels may be designed by partially limiting a sharable current level so that a smaller maximum current Imax is supplied. In detail, when the power channels are able to share a current only within a range of 0.4 A, each power channel may be designed to supply the maximum current Imax of 1.2 A, and a current clamp may be adjusted within an additional range of 0.4 A.

Also, a case where a group includes two power channels has been described, but the same principle of sharing a current amount may be applied to a case where the number of power channels is generalized and each group includes n power channels (n is an integer of 2 or more). The concept of generalizing the number of power channels included in each group to n may be equally applied to other embodiments below.

Referring to FIG. 4B, a power supply 110*b* of the test apparatus 1000 differs from the power supply 110*a* of the test apparatus 1000 of FIG. 4A, in that maximum current amounts of two power channels 112*b* in a group are different from each other. In detail, a first group Group_Ab may include the first power channel 112*b*-1 and a second power channel 112*b*-2. The first power channel 112*b*-1 may output a maximum current of 1.6 A, and the second power channel 112*b*-2 may output a maximum current Iref of 0.8 A. In other words, the first power channel 112*b*-1 may output a current between about 0 A to about 1.6 A, and the second power channel 112*b*-2 may output a current between about 0 A to about 0.8 A. Like the power supply 110*a* of FIG. 4A, a maximum current of the power channels 112*b* may be limited by the current clamp 114, and information about the maximum current may be stored in the mode register 116. In the power supply 110*b* of the present embodiment, capacity of the first power channel 112*b*-1 needs to be increased such that a maximum current of 1.6 A is suppliable, but the second power channel 112*b*-2 supplies a maximum current of 0.8 A, and thus, may use an existing power channel without an increase in capacity.

As such, symmetry may be renounced when sharing current between two power channels in a group; a maximum current of only one power channel, e.g., the first power channel 112*b*-1, may be increased; and a maximum current of a remaining power channel, e.g., the second power channel 112*b*-2, may be maintained as is. Also, each of the power channels 112*b* may be freely connected to any power source (e.g., VDD1 or VDD2) of DUTs through the test board 200, and thus, a substantial current sharing effect may be achieved while minimizing a circuit change.

A maximum current output of each group of the power supply 110*b* may be limited. For example, a maximum current output of the first group Group_Ab may be limited to 1.6 A. In detail, the sum of maximum currents of the first power channel 112*b*-1 and the second power channel 112*b*-2 does not exceed 1.6 A, for example, when the first power channel 112*b*-1 outputs a current of 1.6 A, the second power channel 112*b*-2 outputs a current amount of 0 A; and when the first power channel **112*b*-1 outputs a current amount of 0.8 A, the second power channel 112*b*-2 outputs a maximum current of 0.8 A. However, in the power supply 110*b* of the present embodiment, the maximum current output of the second power channel 112*b*-2 is limited to 0.8 A, and thus, even when the first power channel 112*b*-1 outputs a current of 0 A, the second power channel 112*b*-2** only outputs a maximum current of 0.8 A.

Consequently, the power supply **110*b* of the present embodiment may implement the concept of one-way sharing, in which the two power channels 112*b* share 0.8 A in a group, wherein one power channel, e.g., the first power channel 112*b*-2, draws and uses current of another power channel, e.g., the second power channel 112*b*-2, and the second power channel 112*b*-2 is unable to use a current of the first power channel 112*b*-1. However, in the power supply 110*b* of the present embodiment as well, one group power G/P may be substantially the same as power of two power channels, and as a result, the entire power of the power supply 110*b*** may be substantially the same as the entire power of the power supply P/S of the comparative example including the same number of power channels.

Referring to FIG. 4C, a power supply **110*c* of the test apparatus 1000 differs from the power supply 110*a* of the test apparatus 1000 of FIG. 4A, in that three power channels are included in one group. In detail, a first group Group_Ac may include a first power channel 112*c*-1, the second power channel 112*c*-2, and an additional power channel 112*c*-*s*. Each of the first power channel 112*c*-1, the second power channel 112*c*-2, and the additional power channel 112*c*-*s* may output a maximum current of 0.8 A. Like the power supply 110*a* of FIG. 4A, a maximum current of power channels 112*c* may be limited by the current clamp 114, and information about the maximum current may be stored in the mode register 116. In the power supply 110*c* of the present embodiment, because all of the three power channels 112*c*** only need to supply a maximum current amount of 0.8 A, an existing power channel may be used without an increase in capacity.

In the power supply **110*c* of the present embodiment, the power channels 112*c* in a group may be divided into a supply channel and an additional channel. In detail, in a first group Group_Ac, the first power channel 112*c*-1 and the second power channel 112*c*-2 may correspond to supply channels supplying power to two power sources of a DUT, and the additional power channel 112*c*-*s* may correspond to an additional channel adding a current amount to the first power channel 112*c*-1. Thus, as a result, the first power channel 112*c*-1 may supply a maximum current amount of 1.6 A to the DUT by adding a current amount of the additional power channel 112*c*-*s*, and the second power channel 112*c*-2** may supply a maximum current of 0.8 A to the DUT.

In the power supply **110*c* of the present embodiment, a maximum current output from each group may be the sum of maximum currents of three power channels 112*c*. For example, a maximum current amount of the first group Group_Ac may be 2.4 A. In other words, capacities of the three power channels 112*c* are not increased, and thus, the maximum current output from the group is not required to be limited. Consequently, the power supply 110*c* of the present embodiment may use the concept wherein the first power channel 112*c*-1 and the second power channel 112*c*-2, which are the supply channels, share and use the additional power channel 112*c*-*s* rather than the concept wherein the power channels 112*c* share a current amount in a group. Accordingly, in the power supply 110*c* of the present embodiment, one group power G/P may be substantially the same as power of three power channels, and as a result, the entire power of the power supply 110*c*** of the present embodiment may be substantially the same as the entire power of the power supply P/S of the comparative example including the same number of power channels.

Figure 5A:
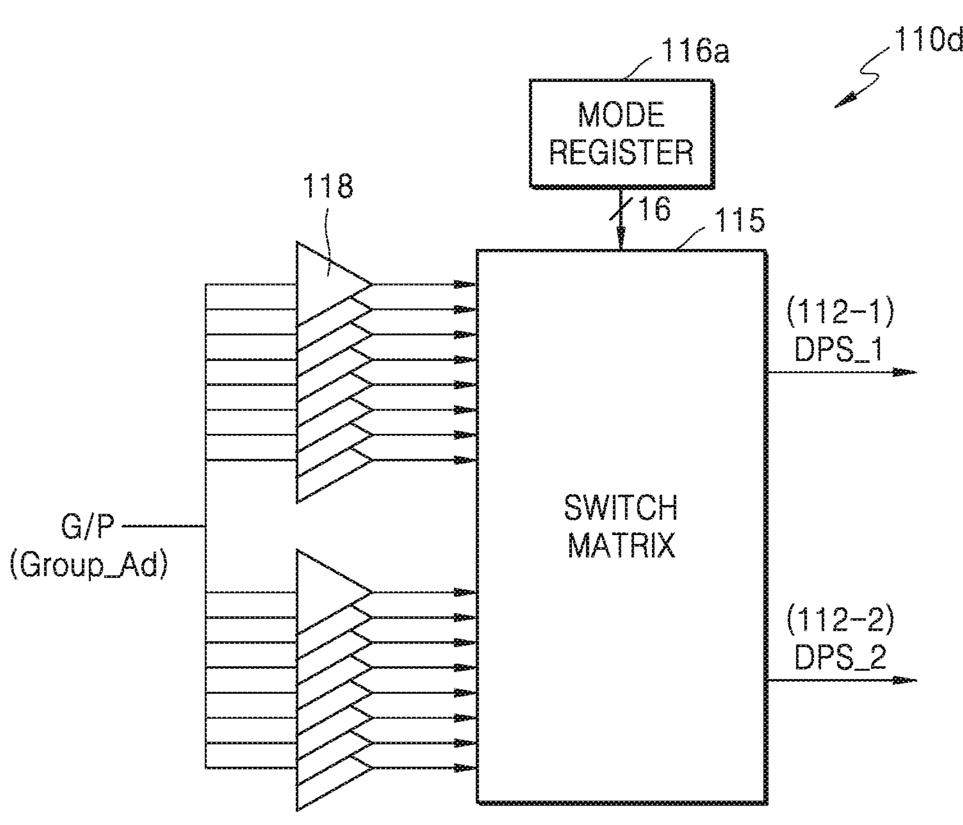
FIGS. 5A and 5B are a circuit diagram of the power supply of FIG. 1B that is specifically implemented and a conceptual diagram of a switch matrix.
Figure 5B:
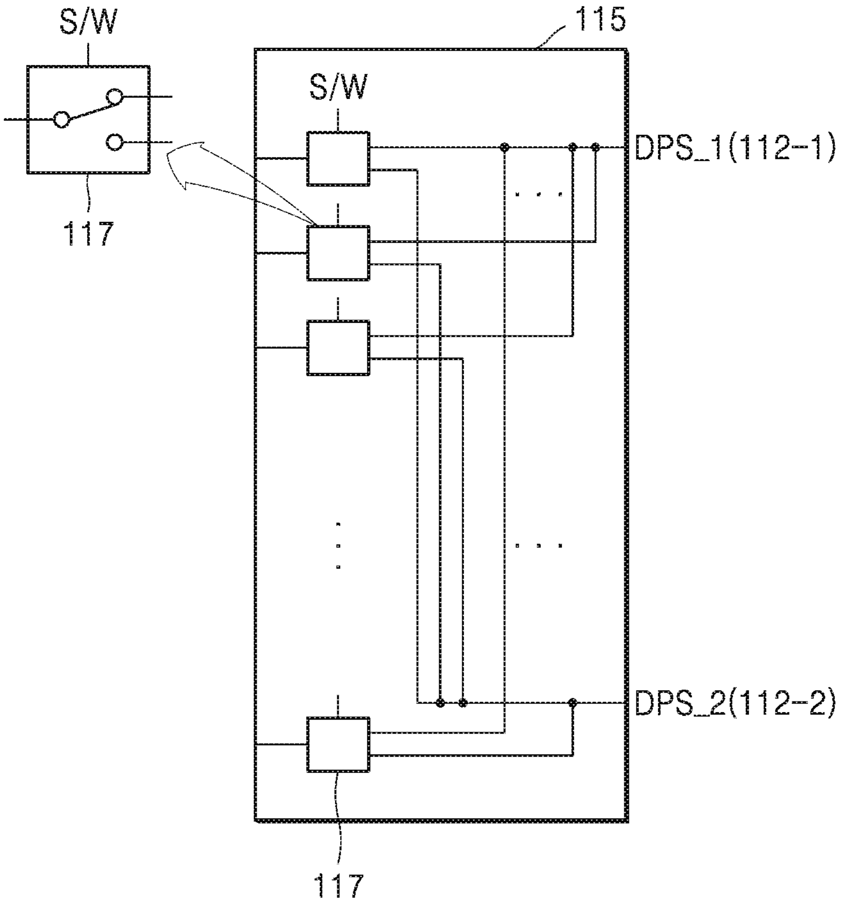

FIG. 5A is a circuit diagram depicting one group "Group_Ad", of power channels 112 forming a power supply **110*d*. Power supply 110*d* is an example of the power supply 110 of FIG. 1B. Although one group of power channels is shown, power supply 110*d* may include multiple groups of similar construction. Power supply 110*d* includes a switch matrix 115, an example of which is shown in FIG. 5B. FIGS. 5A and 5B will be described with reference to FIG. 1B together, and details already described with reference to FIGS. 1A to 3**C will be briefly described or omitted.

Referring to FIGS. 5A and 5B, the power supply **110*d* may further include, in addition to two power channels (the first and second power channels 112-1 and 112-2) in one group, a plurality of sub-power channels 118 and the switch matrix 115. In one example, discussed hereafter to facilitate understanding, the Group_Ad may include 16 sub-power channels 118, the switch matrix 115, and the first and second power channels 112-1 and 112-2**.

The 16 sub-power channels 118 may be connected to a corresponding power channel from among the first and second power channels 112-1 and 112-2 through a switching combination implemented by the switch matrix 115. As shown in FIG. 5B, the switch matrix 115 may include 16 switches 117 respectively corresponding to the 16 sub-power channels 118, and each of the switches 117 may connect the corresponding sub-power channel 118 to the first power channel 112-1 or the second power channel 112-2. Connection information of the switches 117 may be stored in a mode register **116*a*. For example, there are 16 switches 117, and thus 16-bit connection information may be stored in the mode register 116*a*, each bit for controlling a switching signal state S/W of a respective switch 117**.

Each of the 16 sub-power channels 118 may output the same maximum current in this embodiment. In one example, the maximum current output by each sub-power channel is 100 mA. Accordingly, the first and second power channels 112-1 and 112-2 may each output a maximum current of 16 A through the combination by the switch matrix 115. Thus, when all of 16 sub-power channels 118 are connected to the first power channel 112-1, the first power channel 112-1 may output a maximum current of 1.6 A, and the second power channel 112-2 may output a current of 0 A. In another case, when 8 sub-power channels 118 are connected to the first power channel 112-1 and 8 sub-power channels 118 are connected to the second power channel 112-2, each of the first power channel 112-1 and the second power channel 112-2 may output a maximum current of 0.8 A.

A maximum current output of each group of the power supply **110*d* may be limited by the number of sub-power channels 118 and a maximum current of each sub-power channel. For example, in the group Group_Ad, there are 16 sub-power channels 118 and each maximum current output is 100 mA, thus, a maximum current output of the first group Group_Ad may be limited to 1.6 A. Also, a maximum current output of each of the first and second power channels 112-1 and 112-2 may be determined by the number of connected sub-power channels 118 and a maximum current output of each. Accordingly, a separate current clamp is not required for each of the first and second power channels 112-1 and 112-2**.

When the numbers of sub-power channels 118 and power channels 112 are generalized to represent a maximum current output of each of a group and the power channel 112, the maximum current output of each of the group and the power channel 112 may be represented as m*Isub, based on the number of sub-power channels 118 being m (m is an integer greater than the number n of power channels 112 in the group) and a maximum current output of each sub-power channel 118 is Isub.

Thus, the power supply 110*d* may leverage the concept wherein the first and second power channels 112-1 and 112-2 in the group share 1.6 A of maximum available current through use of the sub-power channels 118 and the switch matrix 115. Accordingly, one group power G/P may be substantially the same as power of two power channels, and additional power may not be consumed. Thus, the entire power of the power supply 110*d* may be substantially the same as the entire power of the power supply P/S of the comparative example including the same number of power channels.

A case where the sub-power channels 118 each output a maximum current of 100 mA has been described for the power supply 110*d* of FIG. 5A, but a maximum current amount output by each of the sub-power channels 118 is not limited to 100 mA. For example, each of the sub-power channels 118 may output a maximum current of 200 mA. In this case, eight sub-power channels 118 may be arranged in one group, the switch matrix 115 may include eight switches, and the mode register 116*a* may store 8-bit connection information.

Figure 6A:
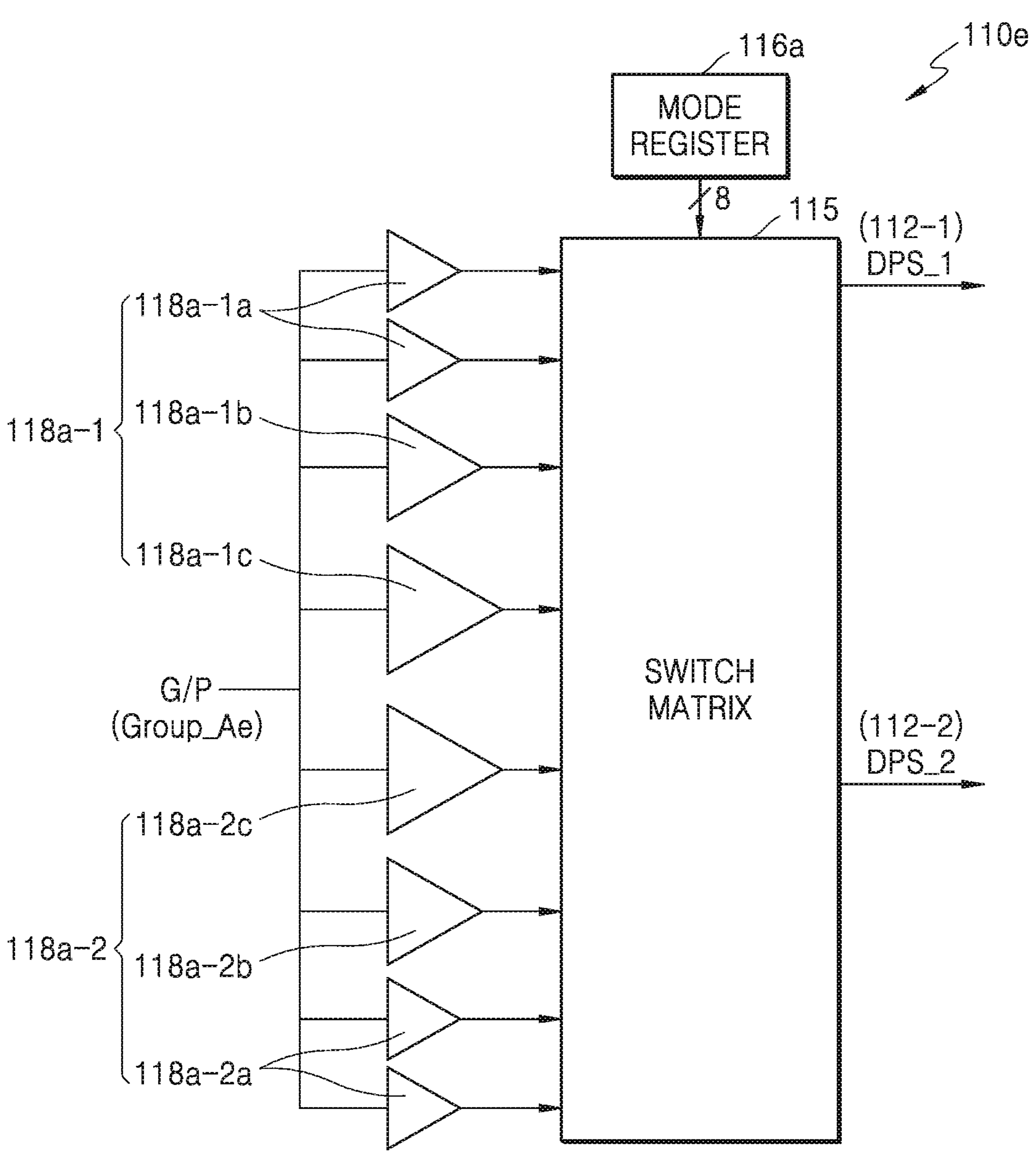
FIGS. 6A, 6B and 6C are circuit diagrams of the power supply of FIG. 1B that is specifically implemented.
Figure 6B:
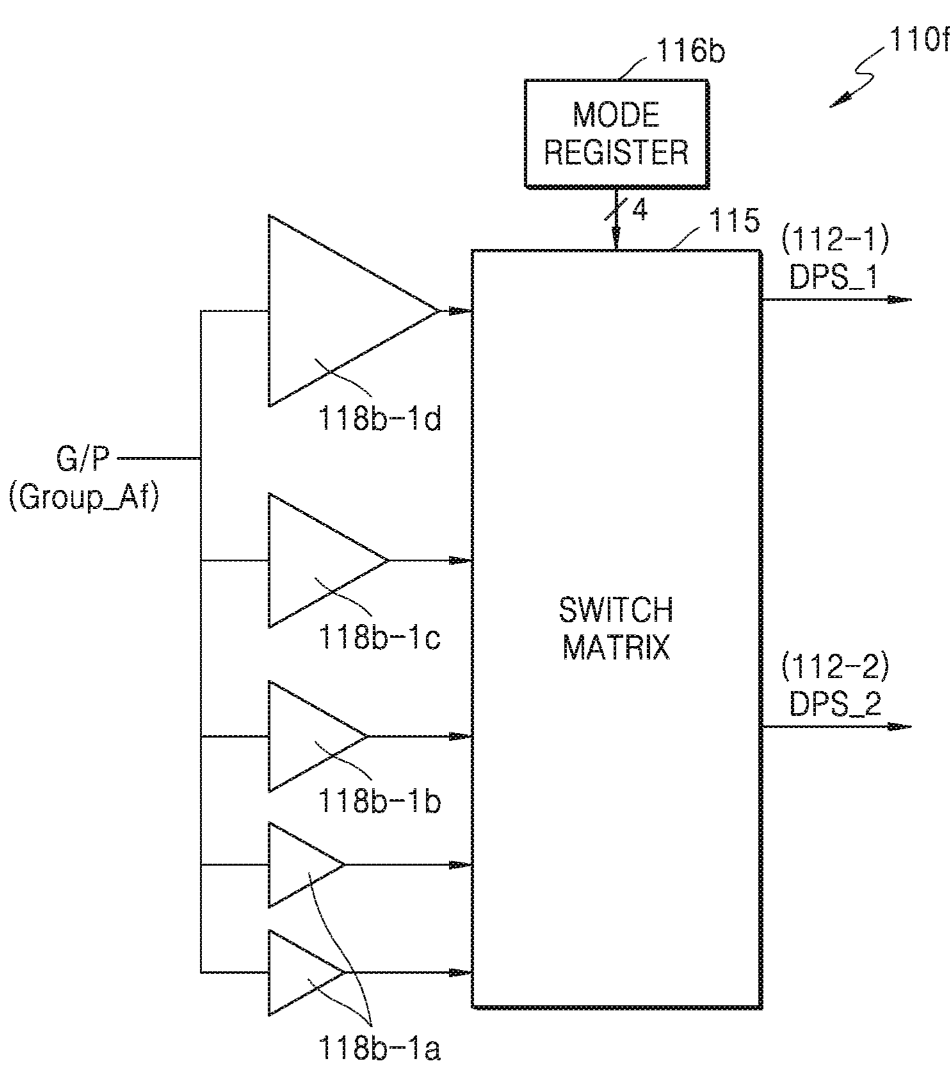
Figure 6C:
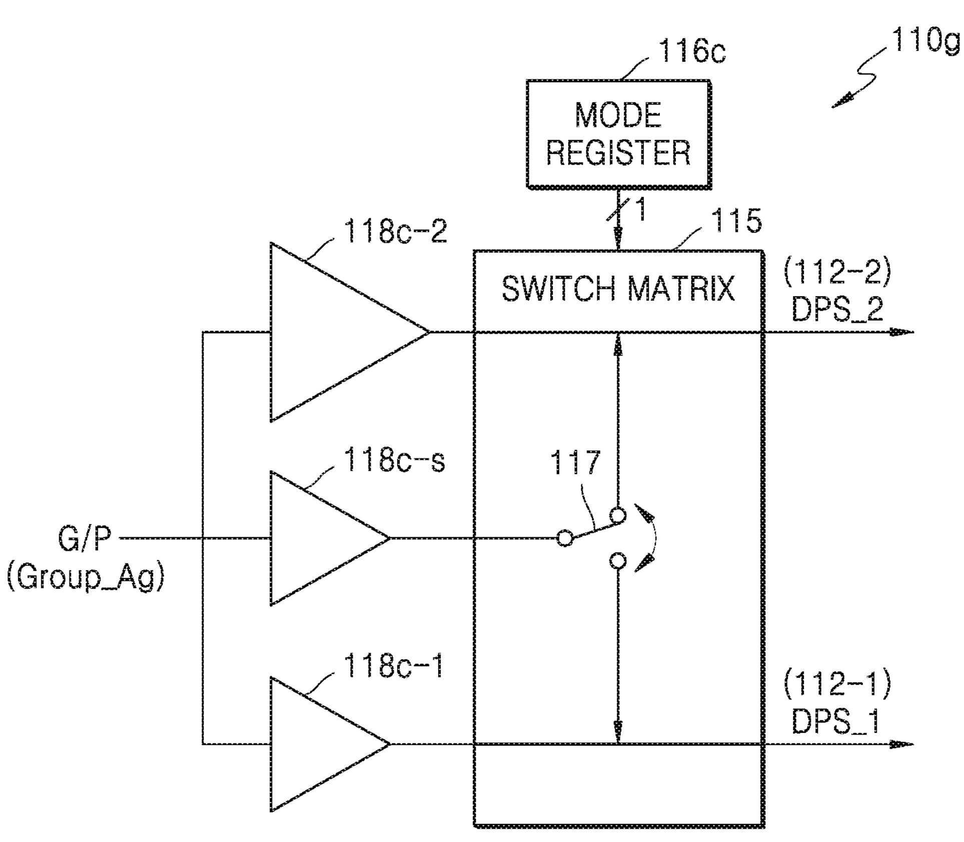

FIGS. 6A to 6C are circuit diagrams of the power supply 110 of FIG. 1B that is specifically implemented, and illustrate circuit diagrams for power channels 112 in one group. FIGS. 6A to 6C will be described with reference to FIGS. 1B, 5A, and 5B together, and details already described with reference to FIGS. 3C, 5A, and 5B will be briefly described or omitted.

Referring to FIG. 6A, a power supply 110*e* of the test apparatus 1000 may differ from the power supply 110*d* of FIG. 5A in that sub-power channels 118*a* in a group are divided into two channel classes: a first channel class 118*a*-1 and a second channel class 118*a*-2. Maximum current outputs of the sub-power channels of the first and second channel classes 118*a*-1 and 118*a*-2 are different from each other. A first group Group_Ae may include eight sub-power channels 118*a*. The eight sub-power channels 118*a* may be distributed among the first channel class 118*a*-1 and the second channel class 118*a*-2.

The first channel class 118*a*-1 may include two first sub-power channels 118*a*-1*a*, one second sub-power channel 118*a*-1*b*, and one third sub-power channel 118*a*-1*c*. The second channel class 118*a*-2 may include two first sub-power channels 118*a*-2*a*, one second sub-power channel 118*a*-2*b*, and one third sub-power channel 118*a*-2*c*. Also, each of four first sub-power channels 118*a*-1*a* and 118*a*-2*a* may output a maximum current of 100 mA, each of two second sub-power channels 118-1*b* and 118-2*b* may output a maximum current of 200 mA, and each of two third sub-power channels 118-1*c* and 118-2*c* may output a maximum current of 400 mA.

The switch matrix 115 may include eight switches according to the number of sub-power channels 118*a*, and the mode register 116*a* may store 8-bit connection information. Also, the first and second power channels 112-1 and 112-2 may each output a maximum current of 1.6 A through the combination by the switch matrix 115.

A maximum current output by each group of the power supply 110*e* may be limited by the sum of maximum current outputs of the sub-power channels 118*a*. For example, in the first group Group_Ae, the sum of maximum current outputs of the sub-power channels 118*a* is 1.6 A, and thus, a maximum current output of the first group Group_Ae may be limited to 1.6 A. A maximum current output by each of the first and second power channels 112-1 and 112-2 is also determined by the sum of maximum current outputs of the connected sub-power channels 118*a*, and thus, a separate current clamp is not required for each of the first and second power channels 112-1 and 112-2.

Thus, the power supply 110*e* may leverage the concept wherein the two power channels 112 in the group share 1.6 A through use of the sub-power channels 118*a* and the switch matrix 115. Accordingly, one group power G/P may be substantially the same as the power of two power channels, and additional power may not be consumed. Thus, the entire power output of the power supply 110*e* may be substantially the same as the entire power output of the power supply P/S of the comparative example including the same number of power channels. In addition, compared with the power supply 110*d* of FIG. 5A, the power supply 110*e* may have half the number of sub-power channels 118*a* and half the number of switches 117 included in the switch matrix 115. Also, the connection information stored in the mode register 116*a* may be reduced to 8 bits.

When the numbers of sub-power channels 118*a* and power channels 112 are generalized to represent a maximum current output by each of the sub-power channels 118*a*, the corresponding group, and power channels 112, m sub-power channels 118*a* may collectively output maximum current levels of two×$2^0$*Isub (e.g., the current output by the two sub-power channels 118*a*-1*a* collectively), plus $2^1$*Isub (e.g., the current output by sub-power channel 118*a*-1*b*), . . . , plus $2^{m-2}$*Isub (e.g., the current output by sub-power channel 118*a*-1*c*), based on the number of channel classes being equal to the number n of the power channels 112 and each channel class including m sub-power channels 118*a*, where m is an integer of 3 or more, and Isub may denote a maximum current amount of the sub-power channel 118*a* having smallest capacity from among the sub-power channels 118*a*. Thus, a maximum current output of each of the group and power channels 112 may be represented as $2*2^0$*Isub+$2^1$*Isub, . . . , +$2^{m-2}$*Isub. (Note that the maximum current supplied by any given power channel of a group is for a case where the other power channel(s) of that group supplies zero current.)

Referring to FIG. 6B, a power supply 110*f* of the test apparatus 1000 may differ from the power supply 110*d* of FIG. 5A, in that maximum current outputs of sub-power channels 118*b* in a group are different from each other. Also, the power supply 110*f* may differ from the power supply 110*e* of FIG. 6A in that the sub-power channels 118*b* are not divided into channel classes.

In the power supply 110*f*, a first group Group_Af may include five sub-power channels 118*b*. The five sub-power channels 118*a* may include two first sub-power channels 118*b*-1*a*, one second sub-power channel 118*b*-1*b*, one third sub-power channel 118*b*-1*c*, and one fourth sub-power channel 118*b*-1*d*. Each of the two first sub-power channels 118*b*-1*a* may output a maximum current of 100 mA, the second sub-power channel 118*b*-1*b* may output a maximum current of 200 mA, the third sub-power channel 118*b*-1*c* may output a maximum current of 400 mA, and the fourth sub-power channel 118*b*-1*d* may output a maximum current of 800 mA.

The switch matrix 115 may include five switches according to the number of sub-power channels 118*a*, and a mode register 116*b* may store 5-bit connection information. Also, the first and second power channels 112-1 and 112-2 may each output a maximum current of 1.6 A through a switching combination implemented by the switch matrix 115. Here, the fourth sub-power channel 118-1*d* may be fixedly connected to the first power channel 112-1 or the second power channel 112-2, and the first and second power channels 112-1 and 112-2 may be connected to respective power sources of a DUT through the test board 200. In this case, the switch matrix 115 may include four switches to perform desired switching between the two first sub-power channels 118*b*-1*a*, the second sub-power channel 118*b*-1*b*, and the third sub-power channel 118*b*-1*c*, and the power channels 112; and the mode register 116*a* may store only 4-bit connection information.

A maximum current output from each group of the power supply 110*f* may be limited by the sum of maximum currents of the sub-power channels 118*b*. For example, in the first group Group_Af, the sum of maximum currents of the sub-power channels 118*b* is 1.6 A, and thus, a maximum current of the first group Group_Af may be limited to 1.6 A. A maximum current of each of the first and second power channels 112-1 and 112-2 is also determined by the sum of maximum currents of the connected sub-power channels 118*b*. Thus, a separate current clamp is not required for each of the first and second power channels 112-1 and 112-2.

Hence, the power supply 110*f* may also leverage the concept wherein the two power channels 112 in the group share and use 1.6 A through use of the sub-power channels 118*b* and the switch matrix 115. Accordingly, one group power G/P may be substantially the same as power of two power channels, and additional power may not be consumed. Thus, the entire power of the power supply 110*f* of the present embodiment may be substantially the same as the entire power of the power supply P/S of the comparative example including the same number of power channels. In addition, compared with the power supply 110*e* of FIG. 6A, the power supply 110*f* of the present embodiment may include three less sub-power channels 118*b* and the number of switches 117 included in the switch matrix 115 may be halved. Also, the connection information stored in the mode register 116*a* may be reduced to 4 bits.

When the numbers of sub-power channels 118*b* and power channels 112 are generalized to represent a maximum current amount of each of the sub-power channels 118*b*, group, and power channels 112, m+1 sub-power channels 118*b* may output maximum current amounts of two× $2^0$*Isub, plus $2^1$*Isub, . . . , plus $2^{m-1}$*Isub, based on each group including m+1 sub-power channels 118*b*, wherein m is an integer of 3 or more. Also, a maximum current amount of each of the group and power channels 112 may be represented as $2*2^0$*Isub+$2^1$*Isub, . . . , +$2^{m-1}$*Isub. Here, Isub may denote a maximum current amount of the sub-power channel 118*b* having smallest capacity from among the sub-power channels 118*b*.

Referring to FIG. 6C, a power supply 110*g* of the test apparatus 1000 may differ from the power supply 110*d* of FIG. 5A, in that maximum current amounts of sub-power channels 118*c* in a group are different from each other. Also, the power supply 110*g* may differ from the power supply 110*e* or 110*f* of FIG. 6A or 6B in that the number of sub-power channels 118*c* in the group is greater than the number of power channels 112 by one.

In detail, in the power supply 110*g*, a first group Group_Ag may include three sub-power channels 118*c*. The three sub-power channels 118*c* may include one first sub-power channel 118-1, one second sub-power channel 118-2, and one additional sub-power channel 118-*s*. Also, the first sub-power channel 118-1 and the additional sub-power channel 118-*s* may each output a maximum current of 400 mA, and the second sub-power channel 118-2 may output a maximum current of 800 mA.

The switch matrix 115 may include one switch 117 connected to the additional sub-power channel 118-*s*, and the mode register 116*a* may store 1-bit connection information. The second power channel 112-2 may output a maximum current of 1.2 A when connected to the additional sub-power channel 118-*s* through the switch 117, and output a maximum current of 0.8 A when not connected to the additional sub-power channel 118-*s*. Also, the first power channel 112-1 may output a maximum current of 0.8 A when connected to the additional sub-power channel 118-*s* through the switch 117, and output a maximum current of 0.4 A when not connected to the additional sub-power channel 118-*s*.

A maximum current output from each group of the power supply 110*g* may be limited by the sum of maximum current amounts of the sub-power channels 118*c*. For example, in the first group Group_Ag, the sum of maximum current amounts of the sub-power channels 118*c* is 1.6 A, and thus, a maximum current amount of the first group Group_Ag may be limited to 1.6 A. A maximum current amount of each of the first and second power channels 112-1 and 112-2 is also determined by the sum of maximum current amounts of the connected sub-power channels 118*c*, and thus, a separate current clamp is not required to be provided for each of the first and second power channels 112-1 and 112-2.

Thus, the power supply 110*g* may use the concept wherein the first and second power channels 112-1 and 112-2 in the group share and use 0.4 A by using the sub-power channels 118*c* and the switch matrix 115. Accordingly, one group power G/P may be substantially the same as power of two power channels, and additional power may not be consumed. Thus, the entire power of the power supply 110*g* may be substantially the same as the entire power of the power supply P/S of the comparative example including the same number of power channels. In addition, compared with the power supply 110*e* of FIG. 6A, the power supply 110*g* may include a remarkably reduced number of sub-power channels 118*c* and one switch 117 included in the switch matrix 115. Also, the connection information stored in a mode register 116*c* may also be reduced to 1 bit.

When the numbers of sub-power channels 118*c* and power channels 112 are generalized to represent a maximum current amount of each of the sub-power channels 118*c*, group, and power channels 112, one of n+1 sub-power channels 118*c* may output a maximum current of Iref and remaining n sub-power channels 118*c* may output a maximum current of Isub, based on that each group includes n power channels 112 and n+1 sub-power channels 118*c*, wherein n is an integer of 2 or more. Also, one of the power channels 112 may output a maximum current of Iref+Isub, a maximum current output of each of the remaining power channels 112 may be 2*Isub, and a maximum current output of the group may be Iref+n*Isub. Here, Iref may denote a maximum current amount assigned to one sub-power channel 118*c*, e.g., the second sub-power channel 118-2, and may be 0.8 that is a maximum current amount of a reference power channel. Also, Isub may denote a maximum current amount assigned to each sub-power channel 118*c*.

Figure 7:
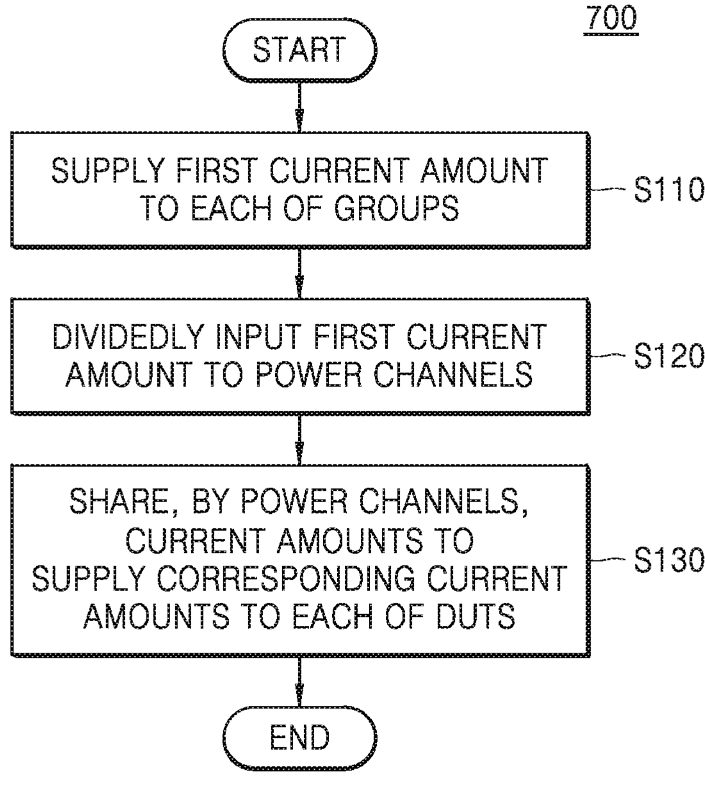
FIG. 7 is a flowchart of a power supply method of a semiconductor test apparatus, according to an embodiment.

FIG. 7 is a flowchart of a power supply method, 700, of a semiconductor test apparatus, according to an embodiment. FIG. 7 will be described with reference to FIGS. 1A and 1B together, and details already described with reference to FIGS. 1A to 6C will be briefly described or omitted.

Referring to FIG. 7, the power supply method 700 may be an example method of the test apparatus 1000 of FIG. 1A. The power supply method 700 may first supply a first current amount to each of groups, in operation S110. The first current amount may correspond to a maximum current amount suppliable by all power channels 112 included in each group to a DUT.

Then, the first current amount is dividedly input to the power channels 112 included in each group, in operation S120. The first current amount may be evenly or unevenly input to the power channels 112 included in the group.

Next, the power channels 112 in the group may share current amounts to supply the corresponding current amounts to each od DUTs, in operation S130. Each of the power channels 112 may output a maximum current of the group, based on the sharing of the current. According to some embodiments, some of the power channels 112 may output a maximum current of the group and the remaining power channels 112 may output a current less than the maximum current of the group, based on the sharing of the available current. According to some embodiments, the power channels 112 may all output a current amount less than the maximum current of the group, based on the sharing of the current. Hereinafter, specific concepts of current sharing of the power channels 112 will be described.

FIGS. 8A to 8E are flowcharts of respective examples of the power supply method 700 of FIG. 7 of the semiconductor test apparatus. FIGS. 8A to 8E will be described with reference to FIGS. 4A to 4C, 5A, and 6 A to 6C together, and details already described with reference to FIGS. 1A to 7 will be briefly described or omitted.

Figure 8A:
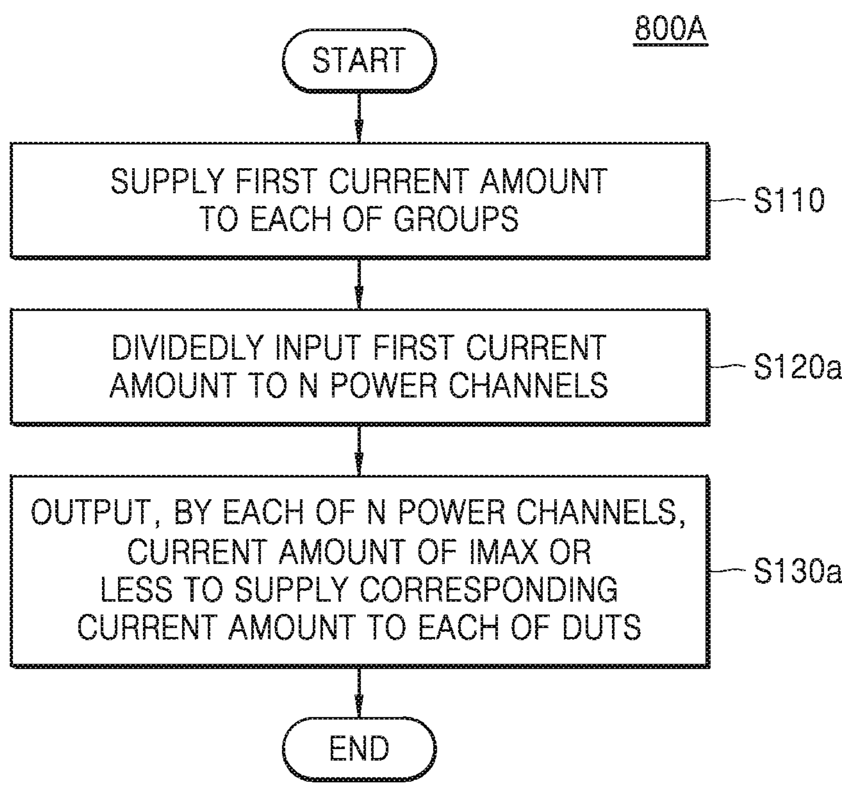
FIGS. 8A, 8B, 8C, 8D and 8E are flowcharts of the power supply method of FIG. 7 of the semiconductor test apparatus, shown in detail, according to various embodiments.

Referring to FIG. 8A, a power supply method 800A is a power supply method performed by the power supply 110*a* of FIG. 4A and may correspond to a case where the number of power channels 112 included in a group is generalized to n, wherein n is an integer of 2 or more. The power supply method 800A may supply the first current amount to each of the groups, in operation S110. Then, the first current amount is dividedly input to the n power channels 112 included in the group, in operation S120*a*. The first current amount may be evenly or unevenly input to the n power channels 112.

Thereafter, each of the n power channels 112 outputs a current amount of Imax or less to supply the corresponding current amount to each of the DUTs, in operation S130*a*. Here, Imax is a maximum current amount suppliable by the group and may be substantially the same as the first current amount input to the group.

Figure 8B:
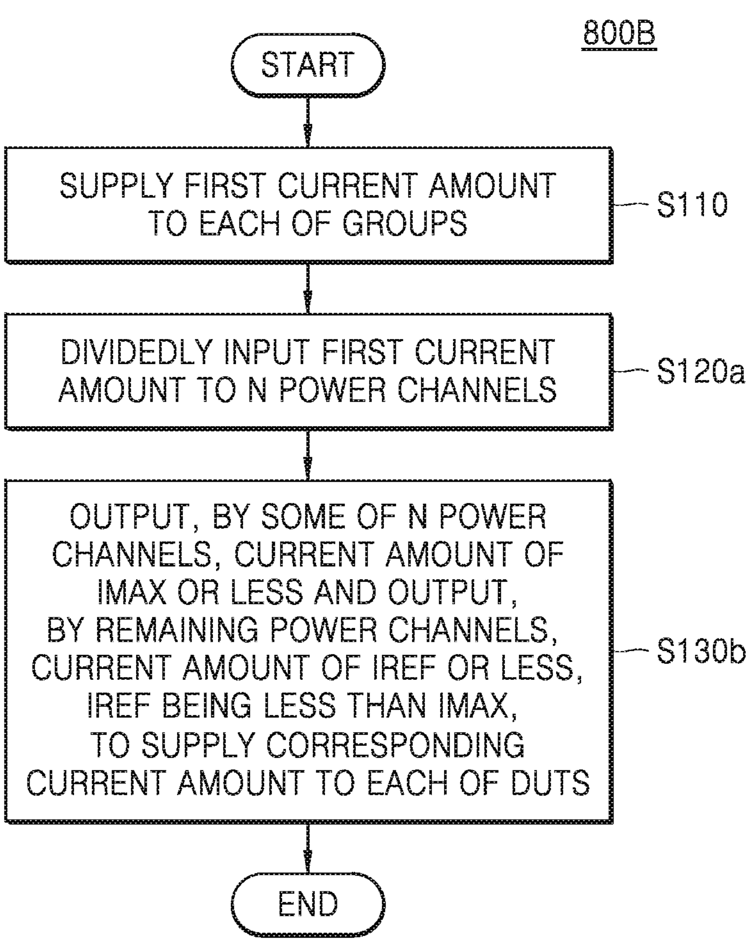

Referring to FIG. 8B, a power supply method 800B is a power supply method performed by the power supply 110*b* of FIG. 4B and may correspond to a case where the number of power channels 112 included in a group is generalized to n, wherein n is an integer of 2 or more. The power supply method 800B may supply the first current amount to each of the groups, in operation S110. Then, the first current amount is dividedly input to the n power channels 112 included in the group, in operation S120*a*. The first current amount may be evenly or unevenly input to the n power channels 112.

Thereafter, some of the n power channels may output a current amount of Imax or less and the remaining power channels may output a current amount of Iref or less, Iref being less than Imax, to supply a corresponding current amount to each of the DUTs, in operation S130*b*. Here, Imax is a maximum current amount suppliable by the group and may be substantially the same as the first current amount input to the group. Also, Iref is a maximum current amount assigned to one power channel 112 and may denote 0.8 that is a maximum current amount of a reference power channel.

Figure 8C:
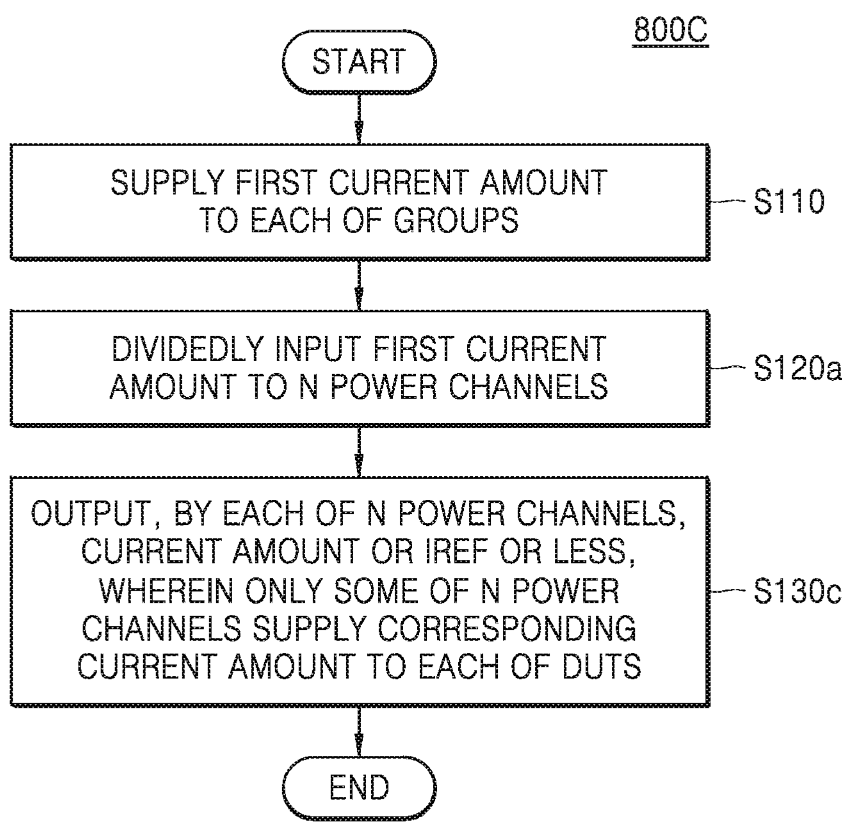

Referring to FIG. 8C, a power supply method 800C is a power supply method performed by the power supply 110*c* of FIG. 4C and may correspond to a case where the number of power channels 112 included in a group is generalized to n, wherein n is an integer of 2 or more. The power supply method 800C may supply the first current amount to each of the groups, in operation S110. Then, the first current amount is dividedly input to the n power channels 112 included in the group, in operation S120*a*. The first current amount may be evenly or unevenly input to the n power channels 112.

Thereafter, each of the n power channels 112 may output a current amount of Iref or less, wherein only some of the n power channels 112 supply a corresponding current amount to each of the DUTs, in operation S130*c*. Here, the power channels 112 supplying the current amounts to the DUTs may correspond to supply channels, and the remaining power channels 112 may correspond to additional channels adding corresponding current amounts to the supply channels. The first current amount that is a maximum current amount suppliable by the group may be represented as n*Iref.

Figure 8D:
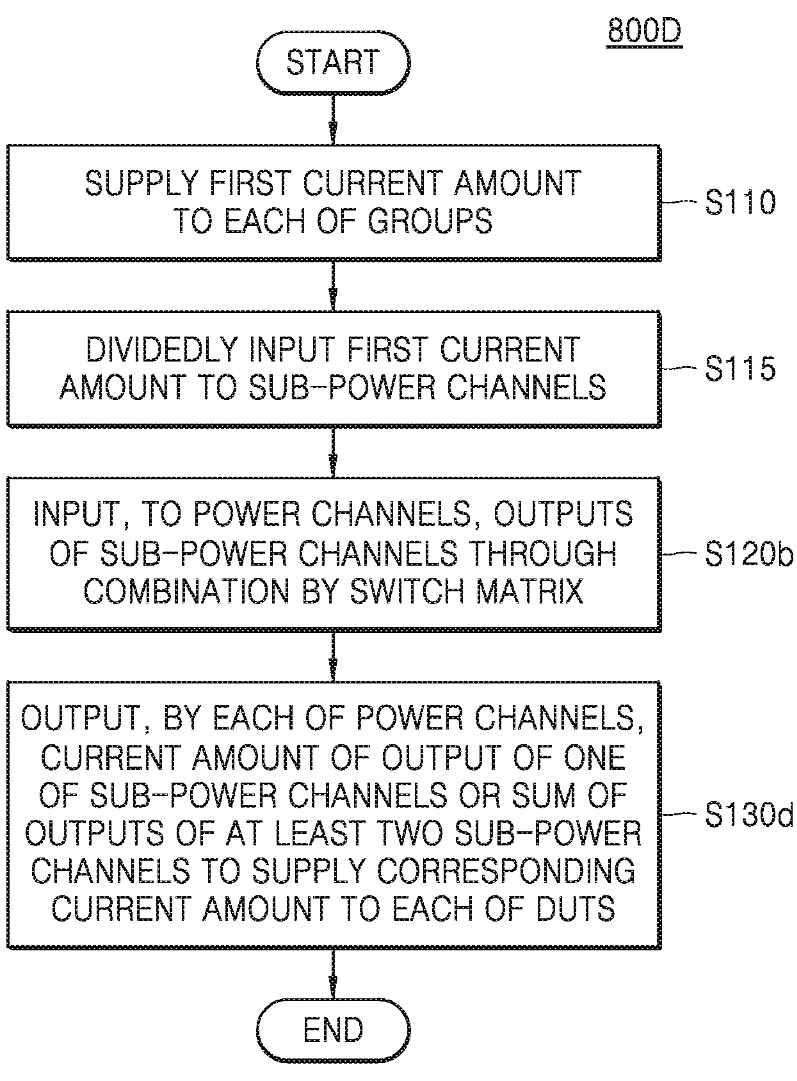

Referring to FIG. 8D, a power supply method 800D may correspond to a case where power supply methods of the power supplies 110*d* to 110*g* of FIGS. 5A and 6A to 6C are combined.

The power supply method 800D may supply the first current amount to each of the groups, in operation S110. Then, the first current amount is dividedly input to sub-power channels included in the group, in operation S115. Then, outputs of the sub-power channels are input to the power channels 112 through a switching combination implemented by the switch matrix 115, in operation S120*b*.

Thereafter, each of the power channels 112 outputs a current amount of an output of one of the sub-power channels or the sum of outputs of at least two sub-power channels to supply a corresponding current amount to each of the DUTs, in operation S130*d*. Outputs of the current amounts of the sub-power channels and the power channels 112 may be different from each other as shown in the power supplies 110*d* to 110*g* of FIGS. 5A and 6A to 6C. Hereinafter, only the power supply method of FIG. 5A will be described as a representative example with reference to FIG. 8E.

Figure 8E:
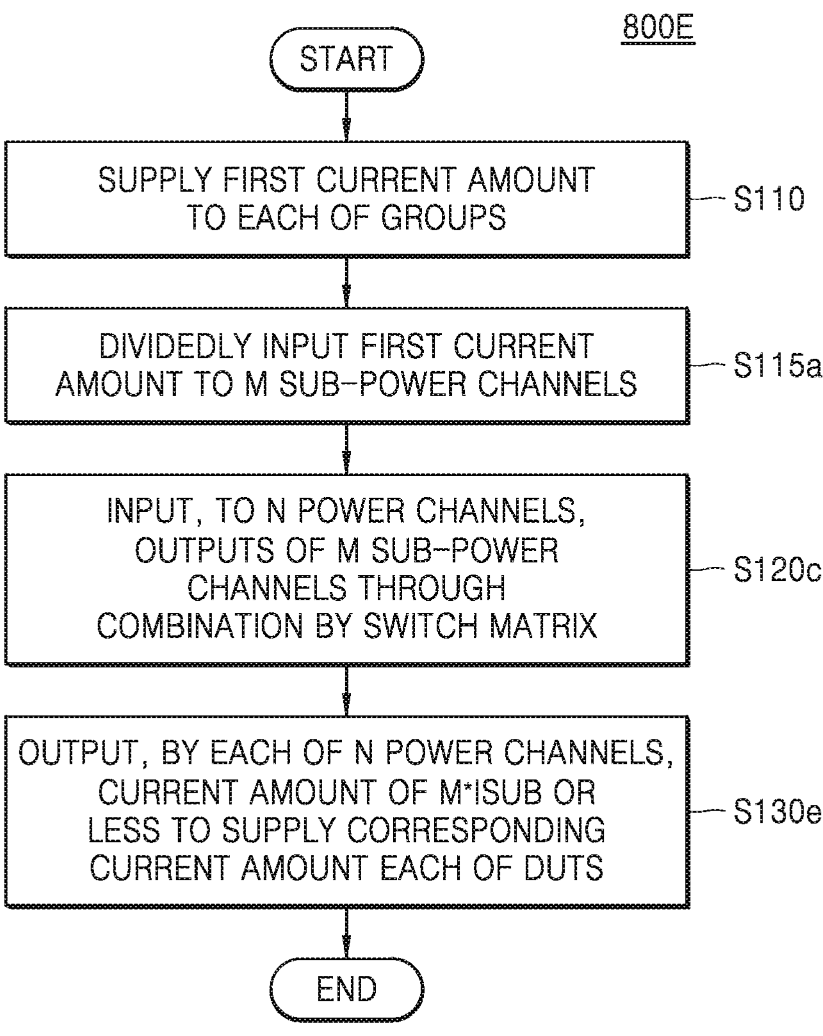

Referring to FIG. 8E, a power supply method 800E is a power supply method of the power supply 110*d* of FIG. 5A and may correspond to a case wherein each group includes the n power channels 112 and m sub-power channels 118, wherein n is an integer of 2 or more and m is an integer greater than n.

The power supply method 800E may supply the first current amount to each of the groups, in operation S110. Then, the first current amount is dividedly input to the m sub-power channels 118 included in the group, in operation S115*a*. Next, outputs of the m sub-power channels 118 are input to the power channels 112 through a combination by the switch matrix 115, in operation S120*c*.

Thereafter, each of the n power channels 112 outputs a current amount of m*Isub or less to supply the corresponding current amount to each of the DUTs, in operation S130*e*. Also, Isub may denote a maximum current output by each of sub-power channels 118. The first current, which is a maximum current amount suppliable by the group, may be represented as m*Isub.

Hereinabove, the inventive concept has been described with reference to the embodiments shown in the drawings, but these embodiments are only examples and it would be understood by one of ordinary skill in the art that various modifications and equivalent embodiments are possible. Accordingly, the scope of the inventive concept will be defined by the appended claims.

What is claimed is:

1. A semiconductor test apparatus comprising:

a tester circuit including a power supply configured to simultaneously supply power to a plurality of devices under test (DUTs) during a test; and a test board arranged between the tester circuit and the plurality of DUTs and routing the power from the power supply to the tester circuit, wherein the power supply includes a plurality of power channels, each of the plurality of DUTs receive two or more types of power from the power channels, each type of power being power supplied at a respective supply voltage for a DUT, and the power supply shares a current output between the plurality of power channels and supplies the current output to each of the plurality of DUTs.

2. The semiconductor test apparatus of claim 1, wherein:

the plurality of power channels are divided into a plurality of groups, each of the plurality of groups includes a set number of power channels, and each group of the plurality of groups shares a current output of the each group between the set number of power channels of the each group.

3. The semiconductor test apparatus of claim 2, wherein each of the plurality of groups includes n power channels, wherein n is an integer of 2 or more, each of the n power channels outputs a current Imax or less, and a maximum current supplied by each of the plurality of groups is Imax.

4. The semiconductor test apparatus of claim 3, wherein a maximum current of each of the n power channels is limited by a current clamp, and a limitation of the current clamp on the maximum current is based on information stored in a mode register.

5. The semiconductor test apparatus of claim 2, wherein each of the plurality of groups includes n power channels, wherein n is an integer of 2 or more, one or more of the n power channels output a current of Imax or less and each of the remainder of the n power channels outputs a current of Iref or less, where Iref is less than Imax, and a maximum current supplied by each of the plurality of groups is Imax.

6. The semiconductor test apparatus of claim 2, wherein each of the plurality of groups includes n power channels, wherein n is an integer of 2 or more, each of the n power channels outputs a current of Iref or less, the n power channels are divided into a supply channel supplying a current to the plurality of DUTs and an additional channel adding a current to the supply channel, and a maximum current amount supplied by each of the plurality of groups is n*Iref.

7. The semiconductor test apparatus of claim 2, wherein each of the plurality of groups includes n power channels arranged at an output side, wherein n is an integer of 2 or more, and m sub-power channels are arranged at an input side, wherein m is an integer greater than n, the m sub-power channels are connected to the n power channels through a switching combination implemented by a switch matrix, each of the m sub-power channels outputs a current of Isub or less, each of the n power channels outputs a current of m*Isub or less, and a maximum current supplied by each of the plurality of groups is m*Isub.

8. The semiconductor test apparatus of claim 7, wherein the switch matrix connects a sub-power channel to a corresponding power channel, according to information stored in a mode register.

9. The semiconductor test apparatus of claim 2, wherein each of the plurality of groups includes n power channels arranged at an output side, wherein n is an integer of 2 or more, and n+1 sub-power channels arranged at an input side, the n+1 sub-power channels are connected to the n power channels through a switching combination implemented by a switch matrix, one of the n+1 sub-power channels outputs a current of Iref or less and each of remaining n sub-power channels outputs a current of Isub or less, one of the n power channels outputs a current of Iref+Isub or less and each of remaining n−1 power channels outputs a current of 2*Isub or less, and a maximum current supplied by each of the plurality of groups is Iref+n*Isub.

10. The semiconductor test apparatus of claim 2, wherein each of the plurality of groups includes n power channels arranged at an output side, wherein n is an integer of 2 or more, and m*n sub-power channels arranged at an input side, wherein m is an integer of 3 or more, wherein:

the m*n sub-power channels are connected to the n power channels through a switching combination implemented by a switch matrix, the m*n sub-power channels include n number of channel classes, wherein each of the n number of channel classes includes m sub-power channels, the m sub-power channels output two currents of $2^0$*Isub or less, and a current of $2^1$*Isub or less to a current of $2^{m-2}$*Isub or less, each of the n power channels outputs current of $2*2^0*Isub+2^1*Isub+, \ldots, +2^{m-2}*Isub$ or less, and a maximum current supplied by each of the plurality of groups is $2*2^0*Isub+2^1*Isub+, \ldots, +2^{m-2}*Isub$.

11. The semiconductor test apparatus of claim 2, wherein each of the plurality of groups includes n power channels arranged at an output side, wherein n is an integer of 2 or more, and m+1 sub-power channels arranged at an input side, wherein m is an integer of 3 or more, the m+1 sub-power channels are connected to the n power channels through a combination by a switch matrix, the m+1 sub-power channels output two currents of $2^0$*Isub or less, and a current of $2^1$*Isub or less to a current of $2^{m-1}$*Isub or less, each of the n power channels outputs current of $2*2^0*Isub+2^1*Isub+, \ldots, +2^{m-1}*Isub$ or less, and a maximum current supplied by each of the plurality of groups is $2*2^0*Isub+2^1*Isub+, \ldots, +2^{m-1}*Isub$.

12. The semiconductor test apparatus of claim 1, wherein the tester circuit further comprises:

a test signal transmitter configured to input a test signal to the plurality of DUTs through the test board and receive a response signal from the plurality of DUTs;

a logic generation determiner circuit configured to generate the test signal and determine a failure of the plurality of DUTs, based on the response signal; and a controller configured to control the power supply and the logic generation determiner circuit.

13. A semiconductor test apparatus comprising:

a tester circuit including a power supply configured to simultaneously supply power to a plurality of devices under test (DUTs) during a test, a test signal transmitter configured to input a test signal to the plurality of DUTs and receive a response signal from the plurality of DUTs, a logic generation determiner circuit configured to generate the test signal and determine a failure of the plurality of DUTs, based on the response signal, and a controller configured to control the power supply and the logic generation determiner circuit; and a test board arranged between the tester circuit and the plurality of DUTs, the test board routing the power of the power supply and the test signal of the test signal transmitter to the plurality of DUTs, and routing the response signal from the plurality of DUTs to the test signal transmitter, wherein the power supply includes a plurality of power channels, the plurality of power channels are divided into a plurality of groups, each of the plurality of groups includes a set number of power channels, and each of the plurality of DUTs receives two or more types of power from the power channels, each type of power being power supplied at a respective supply voltage for a DUT, each of the plurality of groups shares a current output between the plurality of power channels and supplies the current output to each of the plurality of DUTs.

14. The semiconductor test apparatus of claim 13, wherein each of the plurality of groups include n power channels, wherein n is an integer of 2 or more, each of the n power channels outputs a current of Imax or less, or one or more of the n power channels output a current of Imax or less and the remainder of the n power channels output a current of Iref or less, wherein Iref is less than Imax, and a maximum current supplied by each of the plurality of groups is Imax.

15. The semiconductor test apparatus of claim 14, further comprising a mode register, wherein a maximum current of each of the n power channels is limited by a current clamp, and a limitation of the current clamp on the maximum current is based on information stored in the mode register.

16. The semiconductor test apparatus of claim 13, wherein each of the plurality of groups includes sub-power channels arranged at an input side, power channels arranged at an output side, and a switch matrix arranged between the power channels and the sub-power channels, a number of the sub-power channels is greater than a number of the power channels, currents output by the sub-power channels are all equal or at least one thereof is different from other ones, the sub-power channels are connected to the power channels through a switching combination implemented by the switch matrix, and a maximum current supplied by each of the plurality of groups is a sum of maximum currents output by the sub-power channels.

17. The semiconductor test apparatus of claim 16, wherein each of the plurality of groups includes n power channels arranged at the output side, wherein n is an integer of 2 or more, and m sub-power channels arranged at the input side, wherein m is an integer greater than n, the m sub-power channels are connected to the n power channels through the switching combination implemented by the switch matrix, each of the m sub-power channels outputs a current of Isub or less, each of the n power channels outputs a current of m*Isub or less, and the maximum current supplied by each of the plurality of groups is m*Isub.

18. A semiconductor test apparatus comprising:

a power supply configured to simultaneously supply power to a plurality of devices under test (DUTs) during a test;

a test signal transmitter configured to input a test signal to the plurality of DUTs and receive a response signal from the plurality of DUTs;

a logic generation determiner circuit configured to generate the test signal and determine a failure of the plurality of DUTs, based on the response signal; and a controller configured to control the power supply and the logic generation determiner circuit, wherein the power supply includes a plurality of power channels, the plurality of power channels are divided into a plurality of groups, each of the plurality of groups includes a set number of power channels, and each of the plurality of DUTs receives two or more types of power, each type of power being power supplied at a respective supply voltage for a DUT, each of the plurality of groups shares a current output between the plurality of power channels and supplies the shared current output to each of the plurality of DUTs.

19. The semiconductor test apparatus of claim 18, wherein each of the plurality of groups include n power channels, wherein n is an integer of 2 or more, each of the n power channels outputs a current of Imax or less, or one or more of the n power channels output a current of Imax or less and the remainder output a current of Iref or less, wherein Iref is less than Imax, and a maximum current amount supplied by each of the plurality of groups is Imax.

20. The semiconductor test apparatus of claim 18, wherein each of the plurality of groups includes sub-power channels arranged at an input side, power channels arranged at an output side, and a switch matrix arranged between the power channels and the sub-power channels, a number of the sub-power channels is greater than a number of the power channels, currents output by the sub-power channels are all equal or at least one thereof is different from other ones, the sub-power channels are connected to the power channels through a switching combination implemented by the switch matrix, and a maximum current supplied by each of the plurality of groups is a sum of maximum currents of the sub-power channels.

* * * * *